US012805356B2

(12) United States Patent
Tsuji

(10) Patent No.: US 12,805,356 B2
(45) Date of Patent: Nov. 17, 2026

(54) SEMICONDUCTOR DEVICE

(71) Applicant: Sumitomo Electric Industries, Ltd., Osaka (JP)

(72) Inventor: Harutoshi Tsuji, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 472 days.

(21) Appl. No.: 18/439,003

(22) Filed: Feb. 12, 2024

(65) Prior Publication Data

US 2024/0387389 A1 Nov. 21, 2024

(30) Foreign Application Priority Data

May 16, 2023 (JP) ................................ 2023-080916

(51) Int. Cl.

| | |
|---|---|
| ***H10W 70/65*** | (2026.01) |
| ***H10D 1/68*** | (2025.01) |
| ***H10W 70/60*** | (2026.01) |
| ***H10W 72/00*** | (2026.01) |
| ***H10W 90/00*** | (2026.01) |

(52) U.S. Cl.

CPC .............. *H10W 70/65* (2026.01); *H10D 1/68* (2025.01); *H10W 70/611* (2026.01); *H10W 90/00* (2026.01); *H10W 72/884* (2026.01); *H10W 90/734* (2026.01); *H10W 90/755* (2026.01)

(58) Field of Classification Search

CPC . H10W 70/65; H10W 70/611; H10W 72/884; H10W 90/734; H10W 90/755; H10W 90/00; H10D 1/68

See application file for complete search history.

(56) References Cited

FOREIGN PATENT DOCUMENTS

| | | | | |
|---|---|---|---|---|
| JP | 2014-096497 A | | 5/2014 | |
| WO | WO-2021230289 A1 | * | 11/2021 | ............ H10W 44/20 |

* cited by examiner

*Primary Examiner* — Eric W Jones
*Assistant Examiner* — Sammantha K Salaz
(74) *Attorney, Agent, or Firm* — Volpe Koenig

(57) ABSTRACT

A semiconductor device includes a signal terminal, a base, a semiconductor chip having a signal pad provided on an upper surface of the semiconductor chip, a wiring component including a substrate and a first conductor pattern provided on an upper surface of the substrate, a capacitive component including a dielectric substrate, a second conductor pattern provided on an upper surface of the dielectric substrate, and a third conductor pattern provided on an upper surface of the dielectric substrate and separated from the second conductor pattern, a first bonding wire that electrically connects the signal pad to the first conductor pattern, a second bonding wire that electrically connects the first conductor pattern to the second conductor pattern, a third bonding wire that electrically connects the first conductor pattern to the signal terminal, and a fourth bonding wire that electrically connects the signal terminal to the third conductor pattern.

12 Claims, 20 Drawing Sheets

Z0=3 Ω

SEMICONDUCTOR DEVICE

CROSS REFERENCE TO RELATED APPLICATIONS

This application claims priority based on Japanese Patent Application No. 2023-080916 filed on May 16, 2023, and the entire contents of the Japanese patent applications are incorporated herein by reference.

FIELD

The present disclosure relates to a semiconductor device.

BACKGROUND

It is known that a semiconductor chip and a matching circuit for matching the impedance of the semiconductor chip and an external circuit are mounted on a base (for example, Patent Document 1: Japanese Laid-Open Patent Application No. 2014-96497). A capacitive component, a wiring component and bonding wires mounted on the base are used in the matching circuit.

SUMMARY

A semiconductor device according to the present disclosure includes: a signal terminal to which a high-frequency signal is input or output; a base having a conductive upper surface to which a reference potential is supplied; a semiconductor chip mounted on the base and having a signal pad provided on an upper surface of the semiconductor chip; a wiring component mounted on the base and including a substrate and a first conductor pattern provided on an upper surface of the substrate; a capacitive component mounted on the base and including a dielectric substrate, a second conductor pattern provided on an upper surface of the dielectric substrate, and a third conductor pattern provided on an upper surface of the dielectric substrate and separated from the second conductor pattern; a first bonding wire that electrically connects the signal pad to the first conductor pattern; a second bonding wire that electrically connects the first conductor pattern to the second conductor pattern; a third bonding wire that electrically connects the first conductor pattern to the signal terminal; and a fourth bonding wire that electrically connects the signal terminal to the third conductor pattern.

DETAILED DESCRIPTION OF EMBODIMENTS

Figure 1:
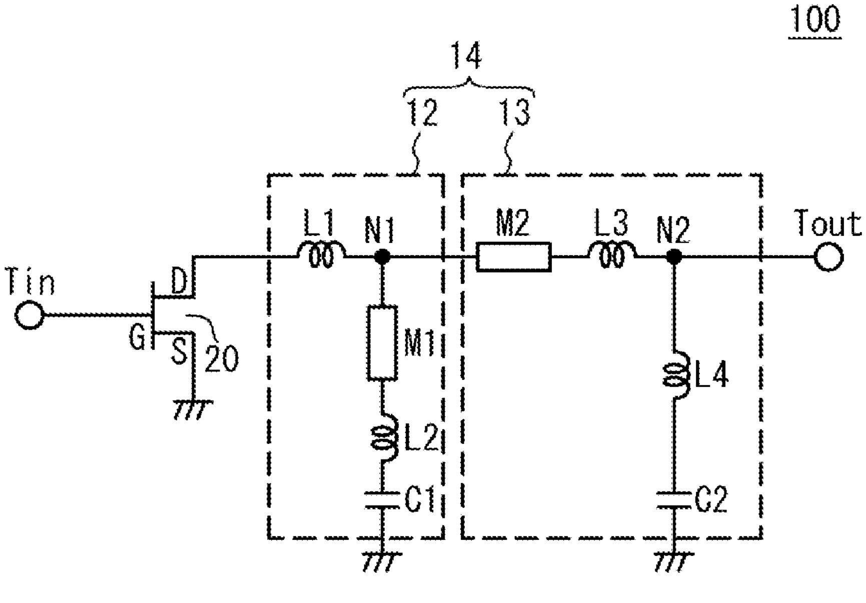
FIG. 1 is a circuit diagram of a semiconductor device according to a first embodiment.

As a matching circuit, a high-pass circuit and a low-pass circuit may be used. In this case, the number of components mounted on the base increases, and the size of the base increases.

The present disclosure has been made in view of the above problems, and it is an object of the present disclosure to provide a semiconductor device that can be reduced in size.

Details of Embodiments of the Present Disclosure

First, the contents of the embodiments of this disclosure are listed and explained.

(1) A semiconductor device according to the present disclosure includes: a signal terminal to which a high-frequency signal is input or output; a base having a conductive upper surface to which a reference potential is supplied; a semiconductor chip mounted on the base and having a signal pad provided on an upper surface of the semiconductor chip; a wiring component mounted on the base and including a substrate and a first conductor pattern provided on an upper surface of the substrate; a capacitive component mounted on the base and including a dielectric substrate, a second conductor pattern provided on an upper surface of the dielectric substrate, and a third conductor pattern provided on an upper surface of the dielectric substrate and separated from the second conductor pattern; a first bonding wire that electrically connects the signal pad to the first conductor pattern; a second bonding wire that electrically connects the first conductor pattern to the second conductor pattern; a third bonding wire that electrically connects the first conductor pattern to the signal terminal; and a fourth bonding wire that electrically connects the signal terminal to the third conductor pattern. This allows the second conductor pattern and the third conductor pattern to be provided on the same upper surface of the dielectric substrate. Therefore, the number of capacitive components can be reduced, and the semiconductor device can be reduced in size.

(2) In the above (1), the dielectric substrate, the second conductor pattern, and the base may form a first capacitor, and the dielectric substrate, the third conductor pattern and the base may form a second capacitor. This allows the first capacitor and the second capacitor to be provided in the same capacitive component.

(3) In the above (2), an area of the second conductor pattern may be larger than an area of the third conductor pattern. This makes it possible to make the capacitance of the first capacitor larger than the capacitance of the second capacitor.

(4) In the above (3), the first bonding wire, the second bonding wire, and the first capacitor may form a high-pass circuit, and the third bonding wire, the fourth bonding wire, and the second capacitor may form a low-pass circuit. This allows the high-pass circuit and the low-pass circuit to be realized using the wiring components and the capacitive components.

(5) In any one of the above (1) to (4), the first conductor pattern may include a solid pattern to which the first bonding wire and the third bonding wire are bonded, and a line pattern connected to an end of the solid pattern close to the semiconductor chip and extending toward the capacitive component, and the second bonding wire may be bonded to an end of the line pattern close to the capacitive component. This allows the line pattern to be used in place of a part of the bonding wire. Thus, melting or burning of the bonding wire can be suppressed.

(6) In any one of the above (1) to (5), a number of third bonding wires may be larger than a number of fourth bonding wires. This can suppress melting or burning of the third bonding wire.

(7) In any one of the above (1) to (6), the second conductor pattern may include a plurality of second conductor patterns, the second bonding wire may include a plurality of second bonding wires, the plurality of second conductor patterns may be provided on the upper surface of the dielectric substrate, and the plurality of second bonding wires connected to the plurality of second conductor patterns, respectively, may be provided with the third bonding wire interposed therebetween. This makes it possible to make the characteristics uniform.

(8) In the above (7), the first bonding wire may include a plurality of first bonding wires, and a first bonding wire located at an end portion of the plurality of first bonding wires in an arrangement direction among the plurality of first bonding wires connected to the first conductor pattern may be longer than a first bonding wire located at a center portion of the plurality of first bonding wires in the arrangement direction among the plurality of first bonding wires. This makes it possible to make the characteristics uniform.

(9) In any one of the above (1) to (8), the third conductor pattern may include a plurality of third conductor patterns, the fourth bonding wire may include a plurality of fourth bonding wires, the plurality of third conductor patterns may be provided on the upper surface of the dielectric substrate, and the plurality of fourth bonding wires connected to the plurality of third conductor patterns, respectively, may be provided with the third bonding wire interposed therebetween. This makes it possible to make the characteristics uniform.

(10) In any one of the above (1) to (9), the first conductor pattern may include a plurality of the first conductor patterns provided on the upper surface of the substrate in a direction intersecting the arrangement direction of the semiconductor chip and the wiring component. This makes it possible to make the characteristics uniform.

(11) In any one of the above (1) to (10), the semiconductor chip may include a transistor, and the signal terminal may output the high-frequency signal. This can suppress the bonding wire from being melted or burned by the signal output from the transistor.

(12) In the above (11), the transistor may be a main amplifier of a Doherty amplifier. This enables the Doherty amplifier to widen a band and to be reduced in size.

Specific examples of a semiconductor device according to embodiments of the present disclosure will be described below with reference to the drawings. It should be noted that the present disclosure is not limited to these examples, but is defined by the claims and is intended to include all modifications within the meaning and scope equivalent to the claims.

First Embodiment

FIG. 1 is a circuit diagram of a semiconductor device according to a first embodiment. As illustrated in FIG. 1, a semiconductor device 100 includes a transistor 20 and a matching circuit 14. The matching circuit 14 includes a high-pass circuit 12 and a low-pass circuit 13. The transistor 20 is, for example, an FET (Field Effect Transistor), and is a GaN HEMT (Gallium Nitride High Electron Mobility Transistor) or an LDMOS (Laterally Diffused Metal Oxide Semiconductor). A source S of the transistor 20 is electrically connected to a ground and is short-circuited. A gate G of the transistor 20 is electrically connected to an input terminal Tin and is short-circuited. A drain D of the transistor 20 is electrically connected to an output terminal Tout via the matching circuit 14.

The high-pass circuit 12 includes an inductor L1, a transmission line M1, an inductor L2, and a capacitor C1. The inductor L1 is connected in series between the drain D and a node N1. The transmission line M1, an inductor L2, and the capacitor C1 are connected in series between the node N1 and the ground (i.e., a reference potential). In order to function as the high-pass circuit 12, a total inductance of the transmission line M1 and the inductor L2 is larger than an inductance of the inductor L1. The capacitor C1 is a capacitor for cutting a DC (Direct Current). The capacitor C1 has a large capacitance so as not to affect the impedance of the transmission line M1 and the inductor L2 in an operating band.

The low-pass circuit 13 includes a transmission line M2, inductors L3 and L4, and a capacitor C2. The transmission line M2 and the inductor L3 are connected in series between the node N1 and a node N2. The inductor L4 and the capacitor C2 are connected in series between the node N2 and the ground. In order to function as the low-pass circuit 13, a total inductance of the transmission line M2 and the inductor L3 is larger than an inductance of the inductor L4. In order to function as the low-pass circuit 13, the capacitor C2 has a small capacitance. The capacitance of capacitor C2 is smaller than the capacitance of capacitor C1.

The transistor 20 amplifies a high-frequency signal input to the input terminal Tin. The amplified high-frequency signal is output to the output terminal Tout via the matching circuit 14. The matching circuit 14 matches an impedance when the matching circuit 14 is viewed from the drain D with an impedance when the output terminal Tout is viewed from the matching circuit 14. When the semiconductor device 100 is used in a base station of the mobile communication, the frequency of the high-frequency signal is, for example, 0.5 GHz or more and 10 GHz or less.

Figure 2:
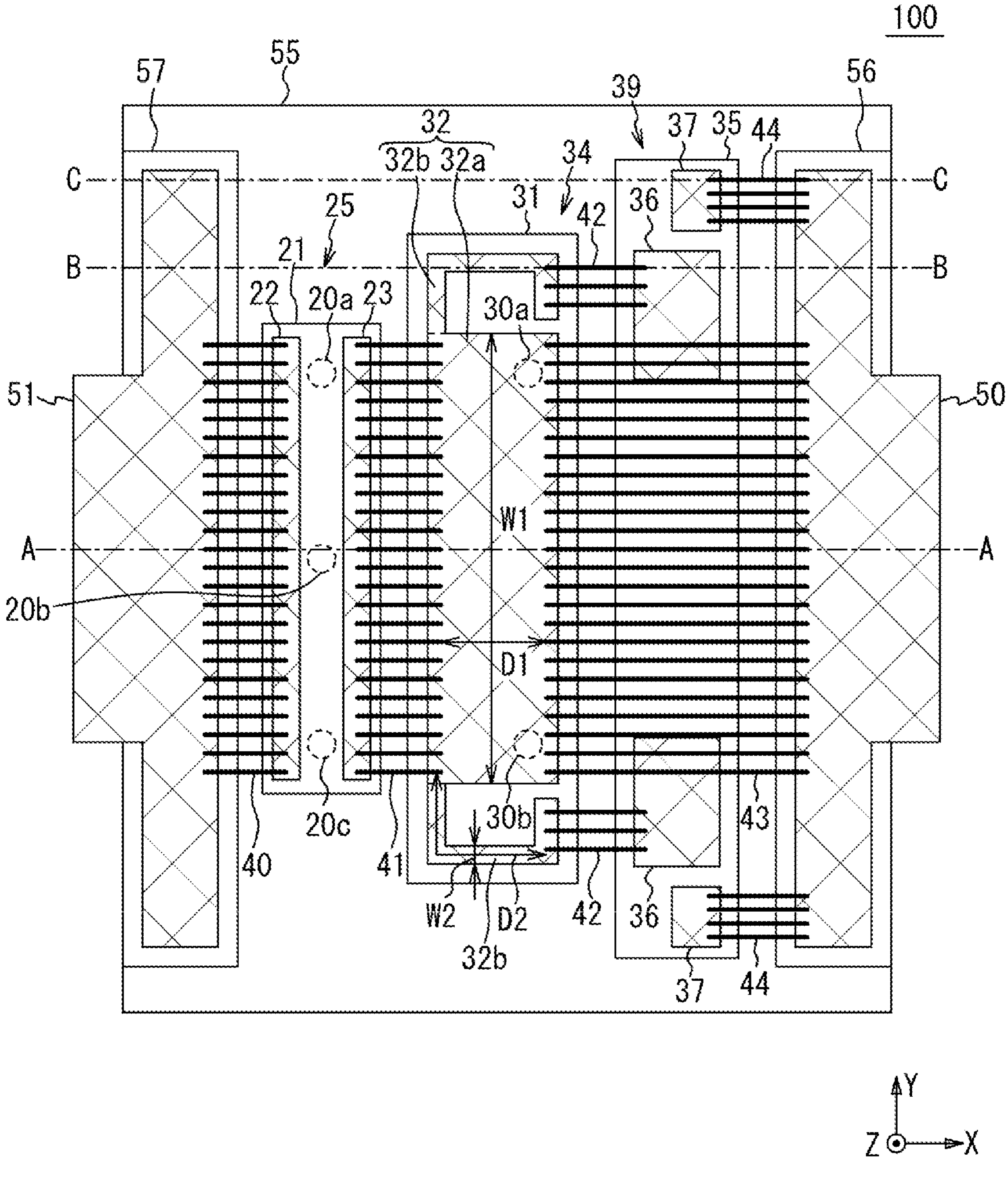
FIG. 2 is a plan view of the semiconductor device according to the first embodiment.
Figure 3:
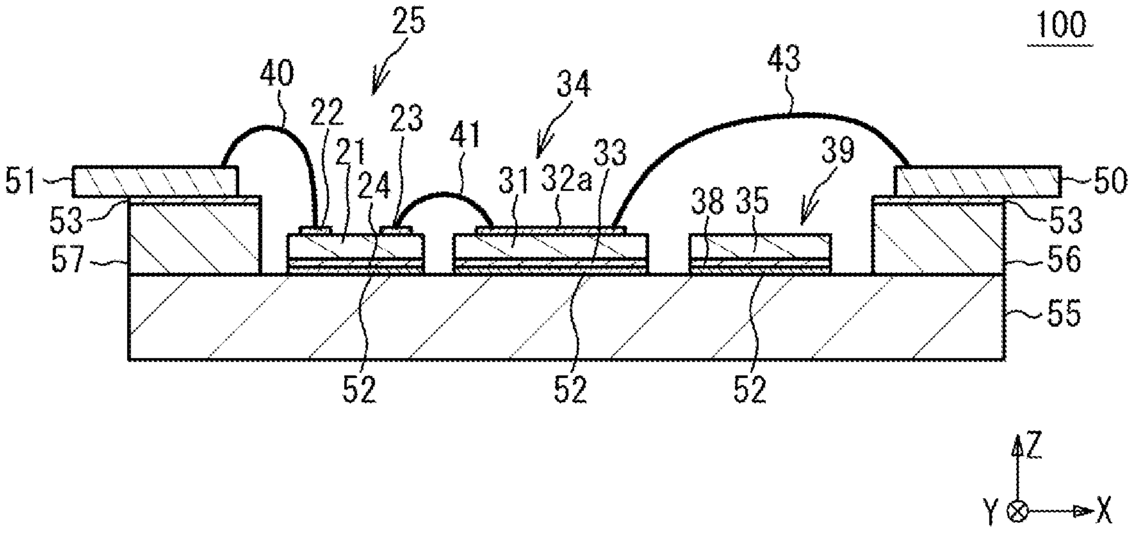
FIG. 3 is a cross-sectional view taken along a line A-A of FIG. 2.
Figure 4:
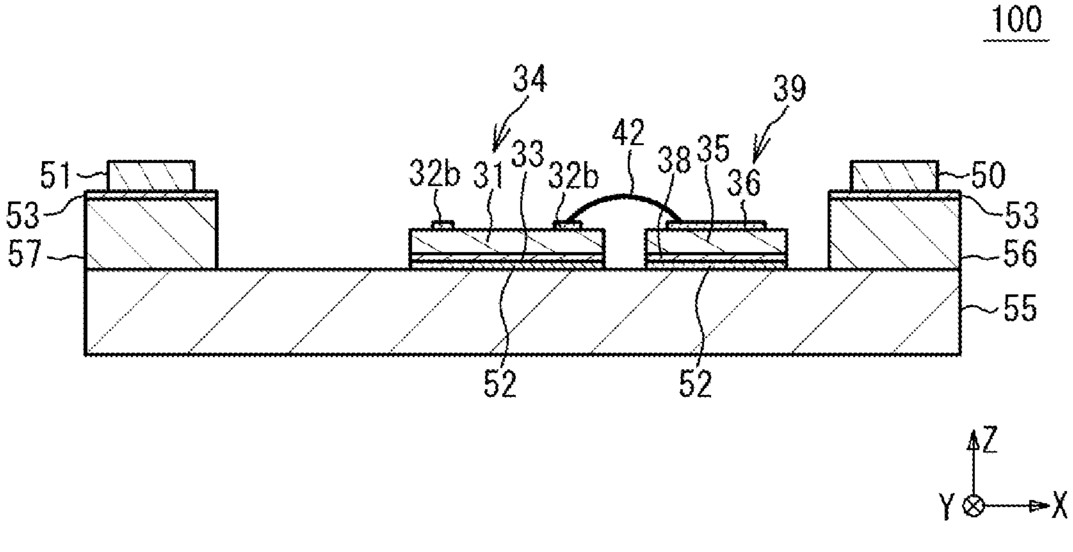
FIG. 4 is a cross-sectional view taken along a line B-B of FIG. 2.
Figure 5:
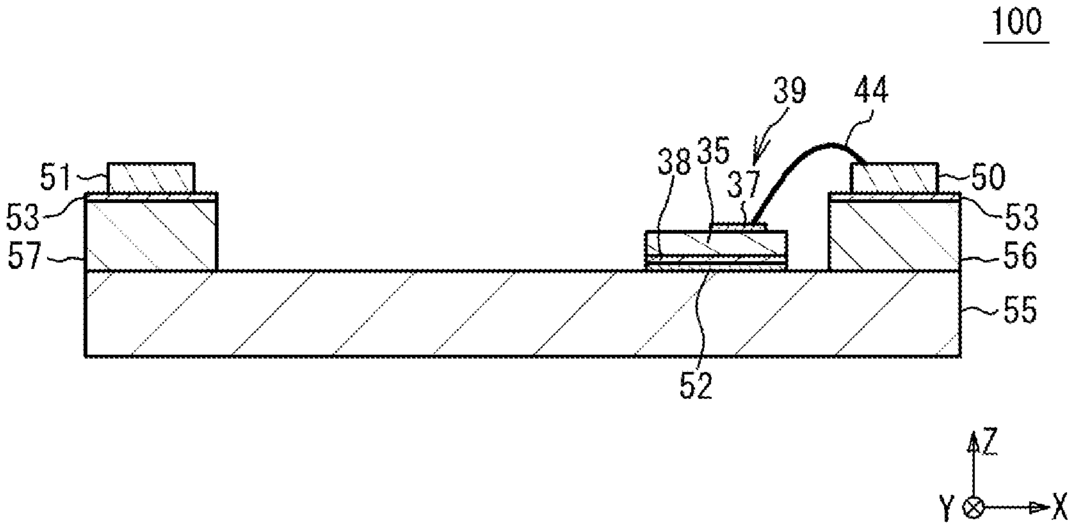
FIG. 5 is a cross-sectional view taken along a line C-C of FIG. 2.

FIG. 2 is a plan view of the semiconductor device according to the first embodiment. FIGS. 3 to 5 are cross-sectional views taken along the lines A-A, B-B and C-C of FIG. 2, respectively. A normal direction of an upper surface of a base 55 is referred to as a Z direction, a direction from an input lead 51 to an output lead 50 is referred to as an X direction, and a direction orthogonal to the X direction and the Z direction is referred to as a Y direction.

As illustrated in FIGS. 2 to 5, in the semiconductor device 100 of the first embodiment, a semiconductor chip 25, a wiring component 34, a capacitive component 39, and supports 56 and 57 are mounted on the base 55. The base 55 is a conductive substrate such as a laminated substrate made of copper and molybdenum, or an insulating substrate made of a resin such as FR-4 (Flame Retardant Type 4) or a ceramic, and the upper surface of the base 55 is a conductive layer such as a copper layer. As described above, the base 55 may be formed on the upper surface thereof with a conductive material. A reference potential such as a ground potential is supplied to the base 55.

The support 56 is provided at a positive end of the base 55 in the X direction, and the support 57 is provided at a negative end of the base 55 in the X direction. The supports 56 and 57 may be provided integrally as a frame that surrounds the semiconductor chip 25, the wiring component 34, and the capacitive component 39. A part of the output lead 50 and a part of the input lead 51 are bonded to the supports 56 and 57, respectively. The input lead 51 and the output lead 50 may be formed of the same metal layer or metal plate as an integral unit. The input lead 51 and the output lead 50 may be bonded to rod-shaped leads on a metal layer provided on the supports 56 and 57, respectively. The supports 56 and 57 are dielectric layers made of resin such as FR-4, or ceramic, for example. Each of the input lead 51 and the output lead 50 is, for example, a metal layer such as copper, or a metal plate. The supports 56 and 57 are bonded to the output lead 50 and the input lead 51 by a bonding layer 53 such as a resin adhesive or a metal bonding layer, respectively.

The semiconductor chip 25, the wiring component 34 and the capacitive component 39 are arranged in the X direction between the input lead 51 and the output lead 50. The semiconductor chip 25 includes a semiconductor substrate 21, pads 22 and 23 provided on an upper surface of the semiconductor substrate 21, and a conductor pattern 24 formed on a lower surface of the semiconductor substrate 21. The pads 22, 23 and the conductor pattern 24 are gate, drain and source electrodes, respectively, and the pads 22 and 23 are input and output pads, respectively. The pads 22 and 23 extend in the Y direction, and the pad 22 is closer to the input lead 51 than the pad 23. A plurality of pads 22 and a plurality of pads 23 may be provided. The transistor 20 includes a plurality of unit transistors 20*a* to 20*c*. The unit transistors 20*a* to 20*c* are connected in parallel between the pads 22 and 23. The unit transistors 20*a* to 20*c* are arranged in the Y direction. Thereby, the length of the semiconductor chip 25 in the Y direction is larger than the length thereof in the X direction. When the transistor 20 is a GaN HEMT, the semiconductor substrate 21 is, for example, a silicon carbide (SiC) substrate, a sapphire substrate, or a gallium nitride (GaN) substrate. The pads 22 and 23 and the conductor pattern 24 are metal layers such as gold layers.

The wiring component 34 includes a substrate 31, a conductor pattern 32 (first conductor pattern) provided on an upper surface of the substrate 31, and a conductor pattern 33 formed on a lower surface of the substrate 31. The conductor pattern 32 includes a solid pattern 32*a* and two line patterns 32*b*. A width of the solid pattern 32*a* in the Y direction is larger than a width of the line pattern 32*b* in the Y direction. The two line patterns 32*b* are connected to a region of the solid pattern 32*a* close to the semiconductor chip 25. The two line patterns 32*b* are symmetrical with respect to a center line extending in the X direction and located at the center in the Y direction of the wiring component 34. Only one line pattern 32*b* may be provided, or three or more line patterns 32*b* may be provided. The substrate 31 is an inorganic insulator such as alumina or a semiconductor such as gallium arsenide (GaAs), gallium nitride (GaN), or silicon. The conductor patterns 32 and 33 are metal layers such as gold layers.

The capacitive component 39 includes a dielectric substrate 35, conductor patterns 36 and 37 provided on an upper surface of the dielectric substrate 35, and a conductor pattern 38 provided on a lower surface of the dielectric substrate 35. The two conductor patterns 37 are provided at both ends of the capacitive component 39 in the Y direction. The two conductor patterns 36 are provided between the two conductor patterns 37 in the Y direction. A capacitor is formed by the conductor pattern 36 and the conductor pattern 38 sandwiching the dielectric substrate 35, and a capacitor is formed by the conductor pattern 37 and the conductor pattern 38 sandwiching the dielectric substrate 35. The conductor patterns 37 may be provided between the plurality of conductor patterns 36. The number of the conductor patterns 36 and 37 may be one or three or more. The dielectric substrate 35 is an inorganic insulator such as barium titanate having a relative dielectric constant higher than that of alumina. The conductor patterns 36, 37 and 38 are metal layers, such as gold layers.

The conductor patterns 24, 33 and 38 are electrically bonded and shorted to the base 55 by a bonding layer 52 such as a metal paste or braze. Thereby, the conductor patterns 24, 33 and 38 have the same potential as the potential of the base 55.

Bonding wires 40 electrically connect the input lead 51 to the pad 22. Bonding wires 41 electrically connect the pad 23 to an end of the solid pattern 32*a* close to the semiconductor chip 25. Bonding wires 42 electrically connect ends of the line patterns 32*b* close to the capacitive component 39 to the conductor patterns 36. Bonding wires 43 electrically connect an end of the solid pattern 32*a* close to the capacitive component 39 to the output lead 50. Bonding wires 44 electrically connect the output lead 50 to the conductor patterns 37. The bonding wires 40 to 44 extend substantially in the X direction in a plan view. The bonding wires 40 to 44 are, for example, gold or aluminum wires.

The input lead 51 and the output lead 50 in FIGS. 2 to 5 correspond to the input terminal Tin and the output terminal Tout in FIG. 1, respectively. The bonding wires 40 correspond to a line between the input terminal Tin in FIG. 1 and the gate G of the transistor 20. The bonding wires 41 correspond to the inductor L1 in FIG. 1. The solid pattern 32*a* corresponds to the transmission line M2 in FIG. 1. The bonding wires 43 correspond to the inductor L3 in FIG. 1. The line pattern 32*b* corresponds to the transmission line M1 in FIG. 1. The bonding wires 42 correspond to the inductor L2 in FIG. 1. The conductor patterns 36 and 38 sandwiching the dielectric substrate 35 correspond to the capacitor C1 in FIG. 1. The bonding wires 44 correspond to the inductor L4 in FIG. 1. The conductor patterns 37 and 38 sandwiching the dielectric substrate 35 correspond to the capacitor C2 in FIG. 1.

A total inductance of the transmission line M1 and the inductor L2 in FIG. 1 is increased. Therefore, the line pattern 32*b* in FIG. 2 is formed to be thin and long, and the number of the bonding wires 42 is reduced. The inductance of the inductor LA in FIG. 1 is reduced. Therefore, the bonding wire 44 in FIG. 2 is shortened. The capacitance of the capacitor C1 in FIG. 1 is made larger than the capacitance of the capacitor C2. Therefore, an area of the conductor pattern 36 in FIG. 2 is made larger than an area of the conductor pattern 37. The high-frequency signal having a large power flows between the transistor 20 and the output terminal Tout in FIG. 1. Therefore, the number of the bonding wires 41 and 43 is increased.

An example of a reason for combining the high-pass circuit 12 and the low-pass circuit 13 in the matching circuit 14 of the first embodiment will be described. A circuit A has a circuit configuration of a comparative example, and a circuit B has a circuit configuration of the first embodiment.

[Circuit A]

Figure 6:
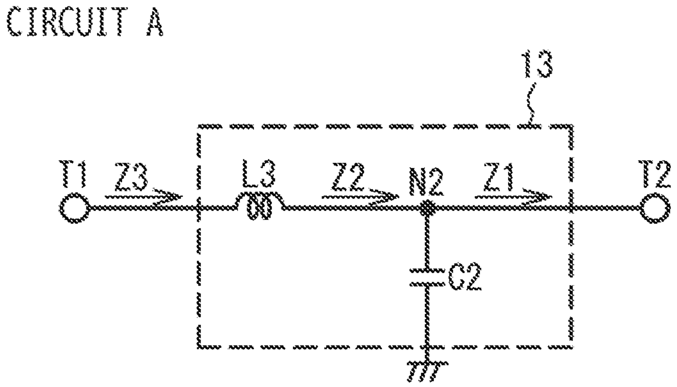
FIG. 6 is a circuit diagram of a matching circuit in a circuit A.

FIG. 6 is a circuit diagram of a matching circuit in the circuit A. As illustrated in FIG. 6, the matching circuit in the circuit A includes the low-pass circuit 13 but does not include the high-pass circuit 12. In the low-pass circuit 13, the inductor L3 is connected in series between the terminals T1 and T2, and the capacitor C2 is shunt-connected to the node N2 between the inductor L3 and the terminal T2. The terminal T1 is connected to the drain D of the transistor 20 in FIG. 1.

Figure 7:
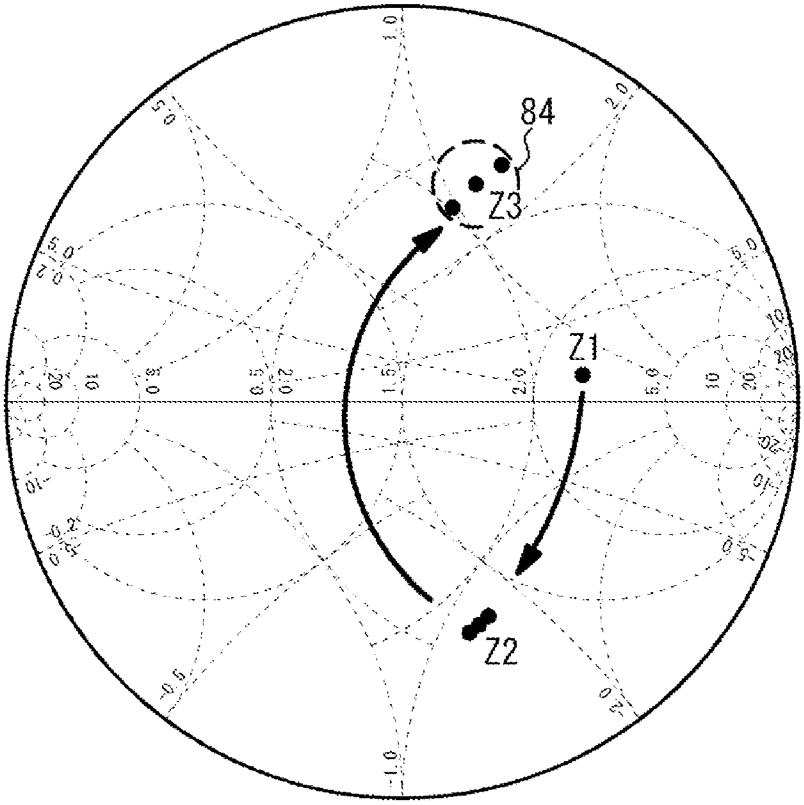
FIG. 7 is a Smith chart illustrating an example of an impedance in the circuit A.

FIG. 7 is a Smith chart illustrating an example of an impedance in the circuit A. An impedance when the terminal T2 is viewed from the low-pass circuit 13 is referred to as an impedance Z1, an impedance when the node N2 is viewed from the inductor L3 is referred to as an impedance Z2, and an impedance when the inductor L3 is viewed from the terminal T1 is referred to as an impedance Z3. Each point of the impedances Z1 to Z3 corresponds to frequencies of 3.4 GHz, 3.6 GHz and 3.8 GHz. A reference impedance (or normalized impedance) Z0 is 3Ω. The reference impedance Z0 corresponds to an impedance at the center of the Smith chart. The impedance Z1 is approximately 8Ω. A range 84 near the impedance Z3 is a target range of the impedance Z3 when the transistor 20 is a GaN HEMT.

As illustrated in FIG. 7, the impedance Z1 is located substantially on a real axis and is 8Ω. This corresponds to an impedance when a combiner of a Doherty amplifier described later is viewed from a matching circuit of a main amplifier in a second embodiment. The impedance Z1 is converted into the impedance Z2 by the shunt-connected capacitor C2. The impedance Z2 is converted into the impedance Z3 by the inductor L3 connected in series. The impedance Z3 varies depending on the frequencies. This may cause the impedance Z3 to deviate from the range 84.

[Circuit B]

Figure 8:
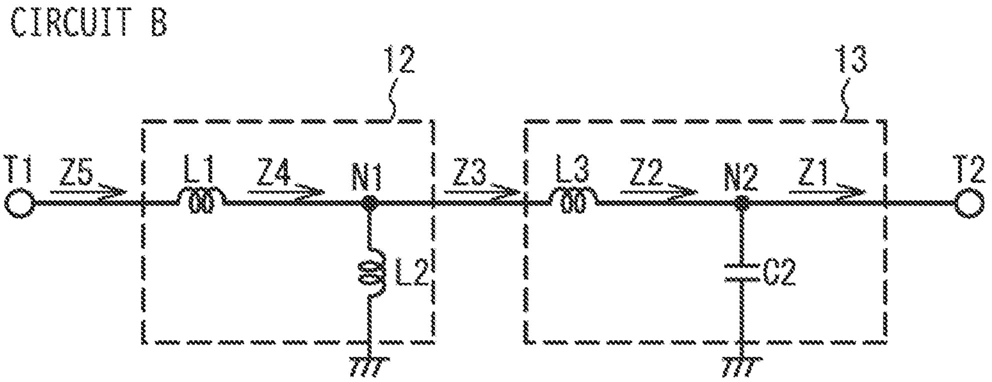
FIG. 8 is a circuit diagram of a matching circuit in a circuit B.

FIG. 8 is a circuit diagram of a matching circuit in the circuit B. As illustrated in FIG. 8, the matching circuit of the circuit B includes the high-pass circuit 12 and the low-pass circuit 13. In the high-pass circuit 12, the inductor L1 is connected in series between the terminal T1 and the low-pass circuit 13, and the inductor L2 is shunt-connected to the node N1 between the inductor L1 and the low-pass circuit 13. The other circuit configuration is the same as that of the circuit A.

Figure 9:
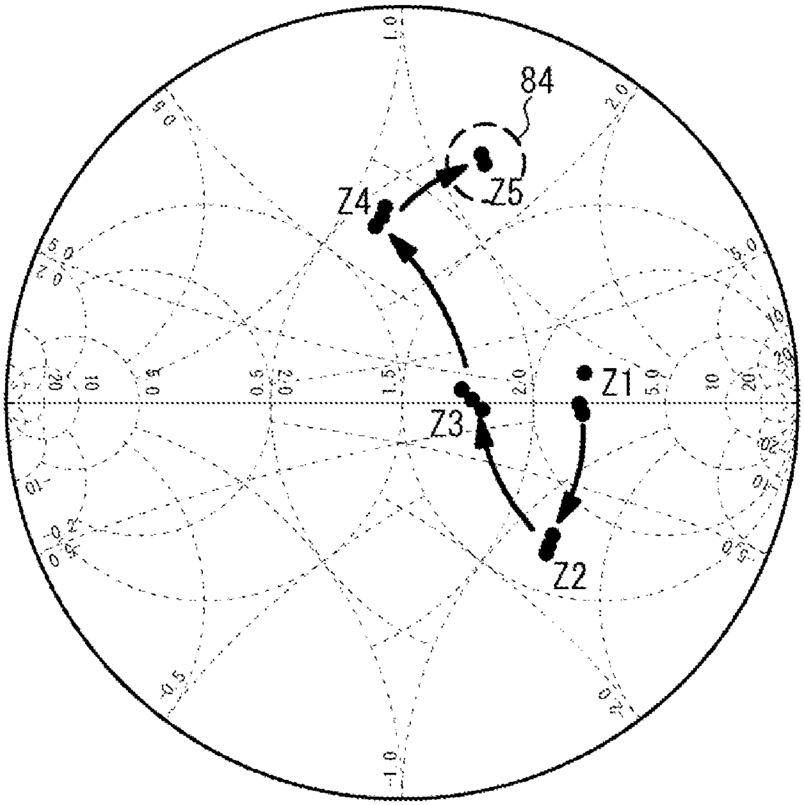
FIG. 9 is a Smith chart illustrating an example of an impedance in the circuit B.

FIG. 9 is a Smith chart illustrating an example of an impedance in the circuit B. The impedance when the terminal T2 is viewed from the low-pass circuit 13 is referred to as the impedance Z1, the impedance when the node N2 is viewed from the inductor L3 is referred to as the impedance Z2, an impedance when the inductor L3 is viewed from the high-pass circuit 12 is referred to as the impedance Z3, an impedance when the node N1 is viewed from the inductor L1 is referred to as an impedance ZA, and an impedance when the inductor L1 is viewed from the terminal T1 is referred to as an impedance Z5. Each point of the impedance Z1 to Z5 corresponds to frequencies of 3.4 GHz, 3.6 GHz and 3.8 GHz. The reference impedance Z0 is 3Ω.

As illustrated in FIG. 9, the impedance Z1 is located substantially on the real axis and is 8Ω. The impedance Z1 is converted into the impedance Z2 by the shunt-connected capacitor C2. The impedance Z2 is converted into the impedance Z3 by the inductor L3 connected in series. The impedance Z3 is converted into the impedance Z4 by the shunt-connected inductor L2. The impedance ZA is converted into the impedance Z5 by the inductor L1 connected in series. Note that the circuit B is not provided with the capacitor C1 for DC cut in FIG. 1. Since the capacitance of the capacitor C1 is sufficiently large, the capacitor C1 hardly affects the impedance conversion of the inductor L2. The impedance Z5 does not vary even when the frequency changes. In this manner, the circuit B can suppress the variation in impedance due to the change of the frequency as compared with the circuit A.

As illustrated by the circuit A, the matching circuit using the low-pass circuit 13 has a small number of components and easily obtains output characteristics and efficiency characteristics. However, as illustrated in FIG. 7, the band of the frequency is narrow. In the circuit B, the high-pass circuit 12 is provided in front of the low-pass circuit 13, thereby widening the band. As described above, the high-pass circuit 12 is sometimes provided at a preceding stage of the low-pass circuit 13 for the purpose of widening the band or for other reasons. However, the circuit B has a large number of components, which increases the cost.

First Comparative Example

Figure 10:
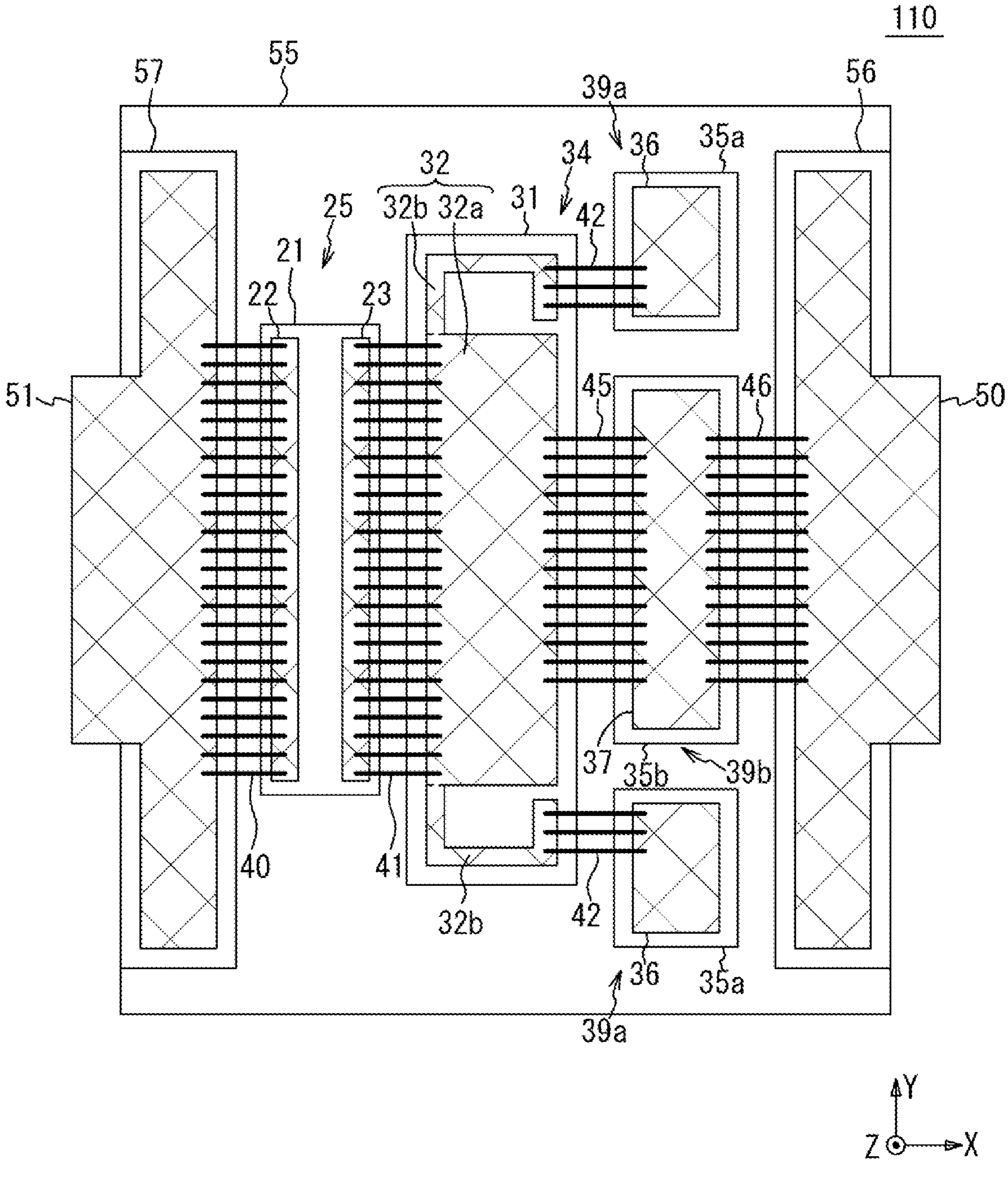
FIG. 10 is a plan view of a semiconductor device according to a first comparative example.

A first comparative example is an example of a semiconductor device that realizes the matching circuit 14 in which the capacitor C1 for DC cut is provided in the circuit B. FIG. 10 is a plan view of a semiconductor device according to the first comparative example. As illustrated in FIG. 10, in a semiconductor device 110 of the first comparative example, two capacitive components 39*a* and one capacitive component 39*b* are mounted on the base 55. In each of the capacitive components 39*a*, the conductor pattern 36 is provided on a dielectric substrate 35*a*. In the capacitive component 39*b*, the conductor pattern 37 is provided on a dielectric substrate 35*b*. Bonding wires 45 electrically connect the solid pattern 32*a* to the conductor pattern 37. Bonding wires 46 electrically connects the conductor pattern 37 to the output lead 50. The solid pattern 32*a* and the bonding wires 45 correspond to the inductor L3 in FIG. 8. The bonding wires 46 corresponds to a line between the node N2 and the output lead 50 in FIG. 8. The conductor pattern 37 and the base 55 sandwiching the dielectric substrate 35*b* correspond to the capacitor C2 in FIG. 8.

Signals having a large power flow through the bonding wires 41, 45, and 46. Therefore, the number of the bonding wires 41, 45 and 46 is increased. Since the number of bonding wires 45 and 46 connected to the conductor pattern 37 is large, the area of the conductor pattern 37 is increased. The capacitance of capacitor C1 of FIG. 1 is larger than the capacitance of capacitor C2. Therefore, the dielectric constant of the dielectric substrate 35*b* is set to be smaller than that of the dielectric substrate 35*a*, thereby increasing the area of the conductor pattern 37. As an example, the capacitance of capacitor C1 is 50 pF to 100 pF. The capacitance of the capacitor C2 is 6 pF. At this time, the relative dielectric constant of the dielectric substrate 35*a* is set to about 250, and the relative dielectric constant of the dielectric substrate 35*b* is set to about 40.

In the first comparative example, the number of the capacitive components 39*a* and 39*b* is three, and the number of components constituting the matching circuit 14 together with the wiring component 34 is four. This increases the cost of the semiconductor device 110.

Second Comparative Example

Figure 11:
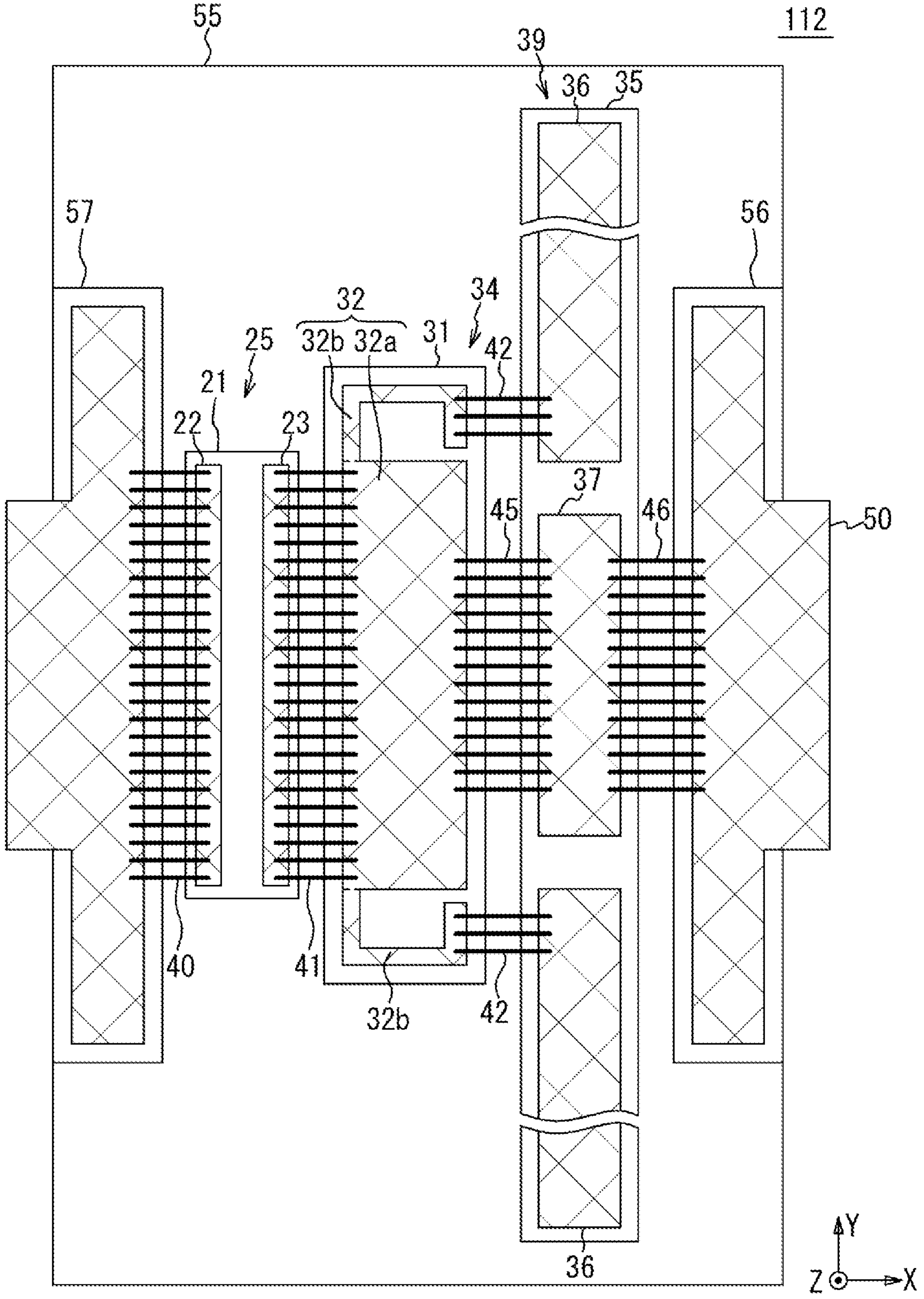
FIG. 11 is a plan view of a semiconductor device according to a second comparative example.

FIG. 11 is a plan view of a semiconductor device according to a second comparative example. As illustrated in FIG. 11, in a semiconductor device 112 of the second comparative example, three capacitive components 39*a* and 39*b* in the first comparative example are replaced with one capacitive component 39. In the capacitive component 39, the conductor patterns 36 and 37 are provided on the dielectric substrate 35. The relative dielectric constant of the dielectric substrate 35 is set to be the same as the relative dielectric constant of the dielectric substrate 35*b* of the first comparative example. In this case, the area of the conductor pattern 37 is not different from that of the conductor pattern 37 of the first comparative example. However, the area of the conductor pattern 36 is larger than that of the conductor pattern 36 of the first comparative example. This increases the size of the capacitive component 39, and increases the size of the semiconductor device 112.

Third Comparative Example

Figure 12:
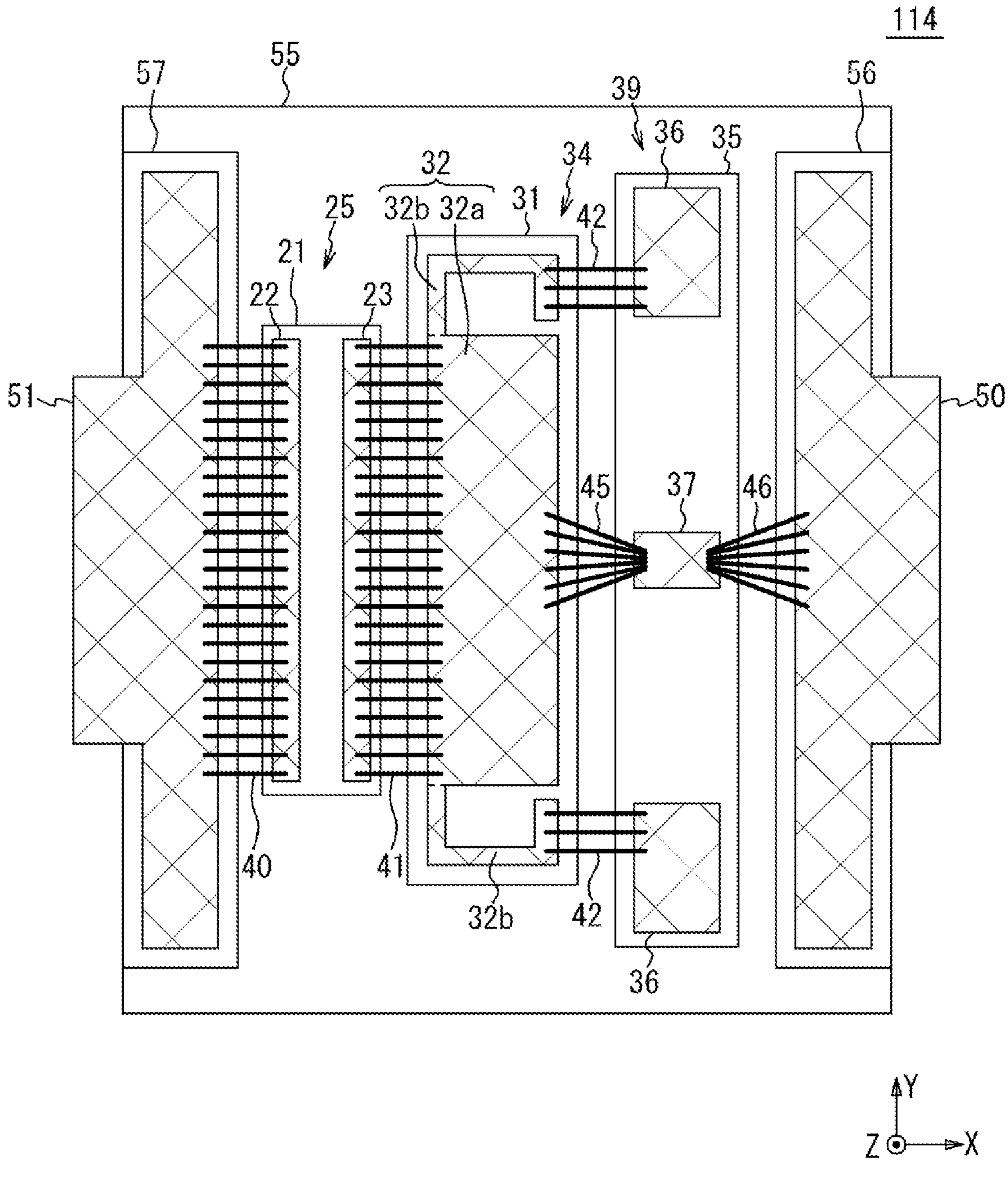
FIG. 12 is a plan view of a semiconductor device according to a third comparative example.

FIG. 12 is a plan view of a semiconductor device according to a third comparative example. As illustrated in FIG. 12, in a semiconductor device 114 of the third comparative example, the number of capacitive components 39 is set to one, and the relative dielectric constant of the dielectric substrate 35 is set to be the same as the relative dielectric constant of the dielectric substrate 35*a* of the first comparative example. In this case, the area of the conductor pattern 36 is not different from that of the conductor pattern 36 of the first comparative example. However, the area of the conductor pattern 37 is smaller than that of the conductor pattern 37 of the second comparative example. Therefore, the number of bonding wires 45 and 46 to be connected to the conductor pattern 37 is reduced. This may cause the bonding wires 45 and 46 to be melted or burned when the signals having the high power flow.

First Embodiment

According to the first embodiment, as illustrated in FIGS. 2 to 5, the capacitive component 39 includes the dielectric substrate 35, the conductor pattern 36 (second conductor pattern) provided on the upper surface of the dielectric substrate 35, and the conductor pattern 37 (third conductor pattern) provided on the upper surface of the dielectric substrate 35 and separated from the conductor pattern 36. The bonding wires 41 (first bonding wire) electrically connect the pad 23 (signal pad) to the conductor pattern 32. The bonding wires 42 (second bonding wire) electrically connect the conductor pattern 32 to the conductor pattern 36. The bonding wires 43 (third bonding wire) electrically connect the conductor pattern 32 to the output lead 50 (signal terminal). The bonding wires 44 (fourth bonding wire) electrically connect the output lead 50 to the conductor pattern 37.

In this manner, the electrical connection between the conductor pattern 32 and the conductor pattern 37 is established via the output lead 50. This increases the number of bonding wires 41 and 43 provided on the line through which the signals having the large power flow from the pad 23 to the output lead 50, thereby suppressing the bonding wires 41 and 43 from being melted or burned. The power of the signals flowing through the bonding wires 44 is not large. Therefore, the number of the bonding wires 44 may be reduced. This makes it possible to reduce the area of the conductor pattern 37. Therefore, the conductor patterns 36 and 37 can be provided on the same upper surface of the dielectric substrate 35. Further, since the number of the bonding wires 43 can be increased, the bonding wires 43 can be prevented from being melted or burned. Therefore, the number of capacitive components can be reduced, and the semiconductor device 100 can be reduced in size.

The upper surface of the base 55 is electrically conductive and is supplied with the reference potential. The semiconductor chip 25, the wiring component 34 and the capacitive component 39 are mounted on the upper surface of the base 55. This allows the lower surfaces of the semiconductor chip 25, the wiring component 34, and the capacitive component 39 to have the same reference potential.

The dielectric substrate 35, the conductor pattern 36, and the base 55 form the capacitor C1 (first capacitor) in FIG. 1. The dielectric substrate 35, the conductor pattern 37, and the base 55 form the capacitor C2 (second capacitor) of FIG. 1. This allows the capacitors C1 and C2 to be provided in the same capacitive component 39.

The area of the conductor pattern 36 is larger than the area of the conductor pattern 37. This makes it possible to make the capacitance of the capacitor C1 larger than the capacitance of the capacitor C2. The area of the conductor pattern 36 is, for example, twice or more, five times or more, or ten times or more the area of the conductor pattern 37. If the area of the conductor pattern 36 is too large with respect to the conductor pattern 37, the capacitive component 39 becomes large. From this viewpoint, the area of the conductor pattern 36 is, for example, 100 times or less the area of the conductor pattern 37.

The bonding wires 41 and 42 and the capacitor C1 form the high-pass circuit 12. The bonding wire 43, the bonding wire 44, and the capacitor C2 form the low-pass circuit 13. Thus, the matching circuit 14 having the high-pass circuit 12 and the low-pass circuit 13 can be realized by using two components.

The number of the bonding wires 43 is larger than the number of the bonding wires 44. This can prevent the bonding wire 43 from being melted or burned. The number of the bonding wires 43 is, for example, twice or more or five times or more the number of the bonding wires 44.

In order to suppress the melting or burning of the bonding wires 41 and to increase the inductance of the bonding wires 42, the number of the bonding wires 41 is larger than the number of the bonding wires 42. The number of the bonding wires 41 is, for example, twice or more or five times or more the number of the bonding wires 42.

As illustrated in FIG. 2, the plurality of unit transistors 20*a* to 20*c* are arranged in the Y direction on the semiconductor chip 25. In one example, the number of unit transistors 20*a* to 20*c* is 32. Assume that the line pattern 32*b*, the bonding wire 42, and the conductor pattern 36 on the positive side in the Y direction are provided, and the line pattern 32*b*, the bonding wire 42, and the conductor pattern 36 on the negative side in the Y direction are not provided. An inductance between the unit transistor 20*c* and the conductor pattern 36 is larger than an inductance between the unit transistor 20*a* and the conductor pattern 36. This causes the inductances connected to the unit transistors 20*a* to 20*c* to differ different from each other, and the impedance matching states of the unit transistors 20*a* to 20*c* to differ from each other.

In the first embodiment, the plurality of conductor patterns 36 are provided on the upper surface of the dielectric substrate 35 in the Y direction. The plurality of bonding wires 42 connected to the plurality of conductor patterns 36 are provided with the bonding wires 43 interposed therebetween in the Y direction. This allows the inductance between the unit transistor 20*c* and the conductor pattern 36 to be substantially the same as the inductance between the unit transistor 20*a* and the conductor pattern 36. The impedance matching states of the unit transistors 20*a* to 20*c* can be made uniform.

Assume that the bonding wires 44 and the conductor pattern 37 on the positive side in the Y direction are provided, and the bonding wires 44 and the conductor pattern 37 on the negative side in the Y direction are not provided. An inductance between a region 30*b* in the solid pattern 32*a* and the conductor pattern 37 is larger than an inductance between a region 30*a* in the solid pattern 32*a* and the conductor pattern 37. This causes the inductances connected to the regions 30*a* and 30*b* to differ from each other, and the impedance matching states of the regions 30*a* and 30*b* to differ from each other.

In the first embodiment, the plurality of conductor patterns 37 are provided on the upper surface of the dielectric substrate 35 in the Y direction. The plurality of bonding wires 44 connected to the plurality of conductor patterns 37 are provided with the bonding wires 43 interposed therebetween in the Y direction. This allows inductance between the region 30*a* and the conductor pattern 37 to be substantially the same as the inductance between the region 30*b* and the conductor pattern 37. The matching state of the impedances of the regions 30*a* and 30*b* on the solid pattern 32*a* can be made uniform.

The signal terminal may be an input lead, and the signal pad may be an input pad. Thus, the signal terminal may be a terminal to which a high frequency signal is input or output.

A semiconductor element provided in the semiconductor chip 25 may be other than the transistor 20. However, in the case where the semiconductor chip 25 includes the transistor 20 and the signal terminal is the output lead 50 for outputting the high frequency signal, the power of the signals flowing through the bonding wires 45 and 46 is increased in the configurations of the first to the third comparative examples. Therefore, in the second comparative example, the semiconductor device is increased in size, and in the third comparative example, the bonding wires 45 and 46 are easily melted or burned. Therefore, as in the first embodiment, the solid pattern 32*a* and the conductor pattern 37 are connected to each other via the output lead 50. The transistor 20 may be other than an FET (Field Effect Transistor).

First Modification of First Embodiment

Figure 13:
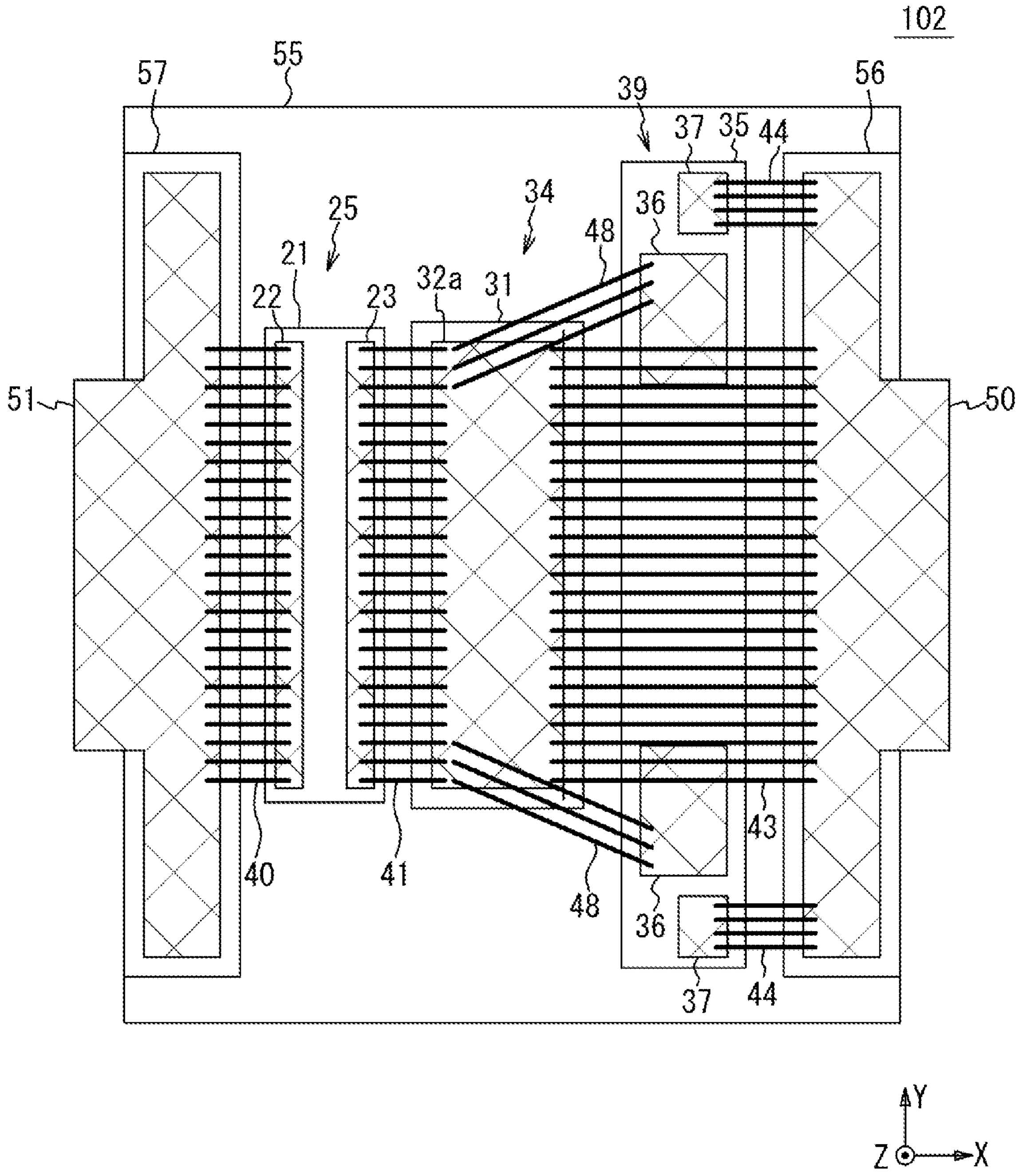
FIG. 13 is a plan view of a semiconductor device according to a first modification of the first embodiment.

FIG. 13 is a plan view of a semiconductor device according to a first modification of the first embodiment. As illustrated in FIG. 13, in a semiconductor device 102 of the first modification of the first embodiment, the line pattern 32*b* is not provided in the conductor pattern 32. Bonding wires 48 electrically connect the solid pattern 32*a* to the conductor pattern 36. The transmission line M1 of FIG. 1 is not provided. In order to increase the inductance of the inductor L2, the bonding wire 48 is lengthened. The other configuration is the same as that of the first embodiment, and the description thereof is omitted.

Second Modification of First Embodiment

Figure 14:
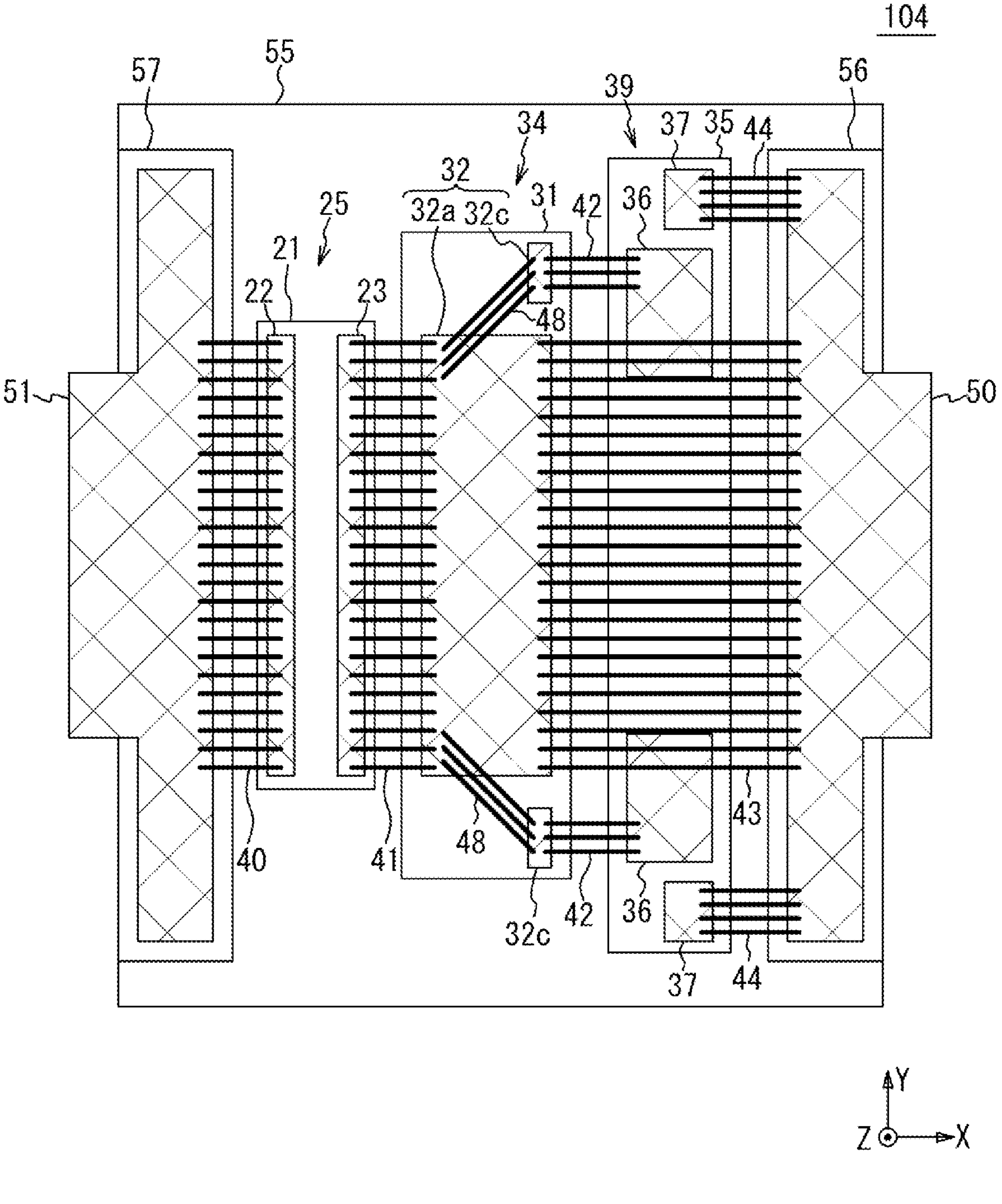
FIG. 14 is a plan view of a semiconductor device according to a second modification of the first embodiment.

FIG. 14 is a plan view of a semiconductor device according to a second modification of the first embodiment. As illustrated in FIG. 14, in a semiconductor device 104 of the second modification of the first embodiment, pads 32*c* are provided on the substrate 31. The bonding wires 48 are provided to electrically connect the solid pattern 32*a* to the pads 32*c*. The bonding wires 42 electrically connects the pads 32*c* to the conductor pattern 36. In order to increase the inductance of the inductor L2, the bonding wire 48 is lengthened. The other configuration is the same as that of the first embodiment, and the description thereof is omitted.

As in the first and second modifications of the first embodiment, the line patterns 32*b* may not be provided in the wiring component 34, and the bonding wires 48 may be used as the inductor. In order to increase the inductance of the bonding wires 48, the bonding wires 48 are made longer and the number of the bonding wires 48 is reduced. This may cause the bonding wire 48 to be melted or burned by the current flowing through the bonding wires 48.

According to the first embodiment, as illustrated in FIG. 2, the conductor pattern 32 includes the solid pattern 32*a* and the line patterns 32*b*. The bonding wires 41 and 43 are bonded to the solid pattern 32*a*. The line patterns 32*b* are connected to the ends of the solid pattern 32*a* close to the semiconductor chip 25 and extend toward the capacitive component 39. The bonding wires 42 are bonded to ends of the line patterns 32*b* close to the capacitive component 39. This allows the line patterns 32*b* to be used as the inductor instead of the bonding wires 48 of the first and second modifications of the first embodiment. Therefore, the bonding wires can be suppressed from being melted or burned.

As illustrated in FIG. 2, a minimum width W2 of the line pattern 32*b* in a direction orthogonal to a direction in which the signal flows is smaller than a minimum width W1 of the solid pattern 32*a* in the direction orthogonal to the direction in which the signal flows. This makes it possible to increase the inductance of the line pattern 32*b*. The minimum width W2 may be equal to or less than one fifth of the minimum width W1. A shortest distance D2 between the bonding wires 41 and 42 via the line pattern 32*b* is longer than a shortest distance D1 between the bonding wires 41 and 43 via the solid pattern 32*a*. This makes it possible to increase the inductance of the line pattern 32*b*. The shortest distance D2 can be set to be 1.2 times or more the shortest distance D1.

Third Modification of First Embodiment

Figure 15:
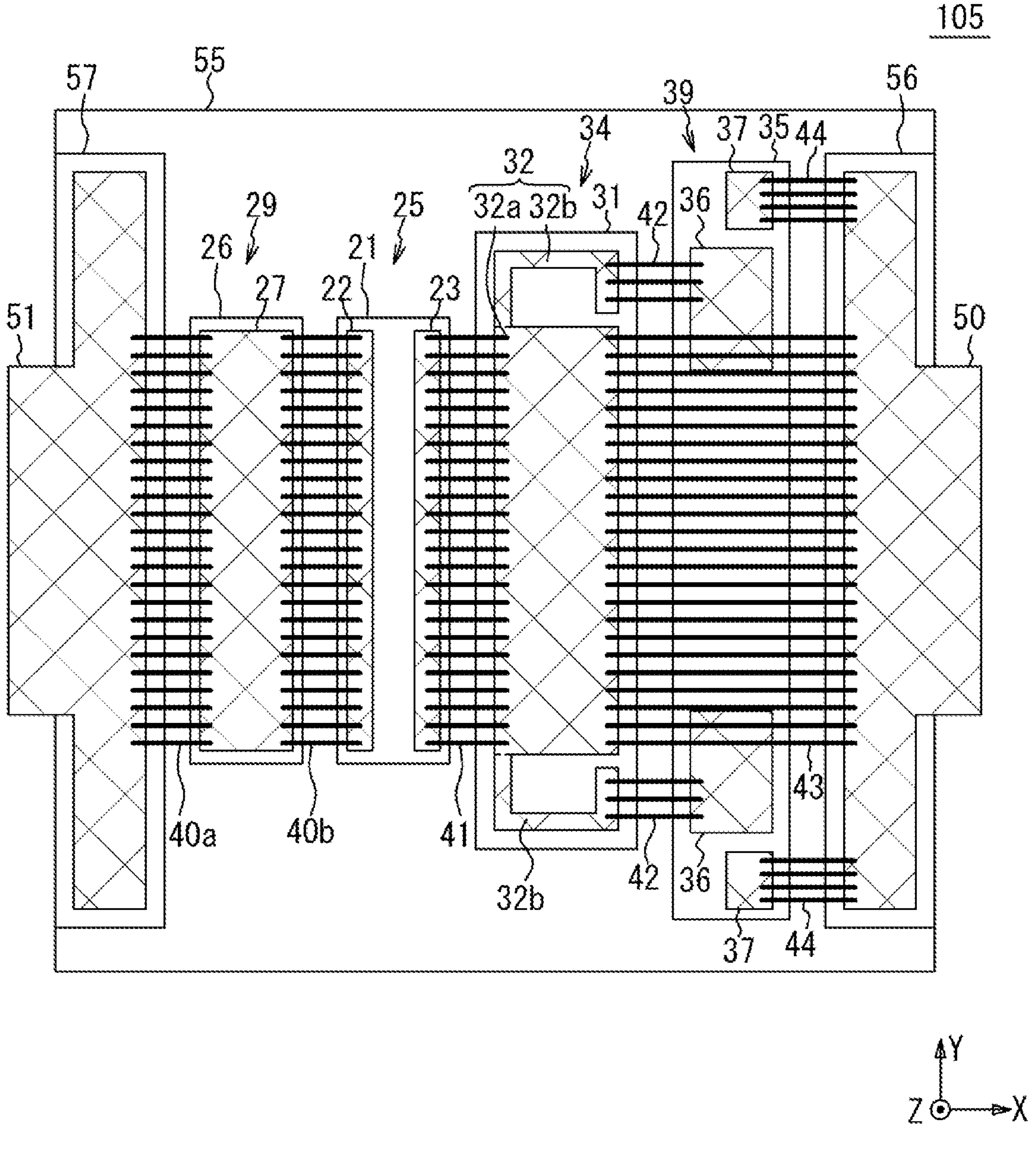
FIG. 15 is a plan view of a semiconductor device according to a third modification of the first embodiment.

FIG. 15 is a plan view of a semiconductor device according to a third modification of the first embodiment. As illustrated in FIG. 15, in a semiconductor device 105 of the third modification of the first embodiment, a capacitive component 29 is provided on the base 55. The capacitive component 29 includes a dielectric substrate 26 and a conductor pattern 27. The conductor pattern 27 is provided on the dielectric substrate 26. Bonding wire 40*a* electrically connect the input lead 51 to the conductor pattern 27. Bonding wire 40*b* electrically connect the conductor pattern 27 to the pad 22. The bonding wires 40*a* and 40*b* form an inductor connected in series between the input lead 51 and the pad 22. The dielectric substrate 26, and the conductor pattern 27 and the base 55 sandwiching the dielectric substrate 26 form a shunt-connected capacitor. The inductor and the capacitor form a matching circuit. As in the third modification of the first embodiment, the semiconductor device 105 may include the matching circuit provided between the input lead 51 and the semiconductor chip 25. The other configuration is the same as that of the first embodiment, and the description thereof is omitted. In the first and second modifications of the first embodiment, the matching circuit may be provided between the input lead 51 and the semiconductor chip 25.

Fourth Modification of Embodiment 1

Figure 16:
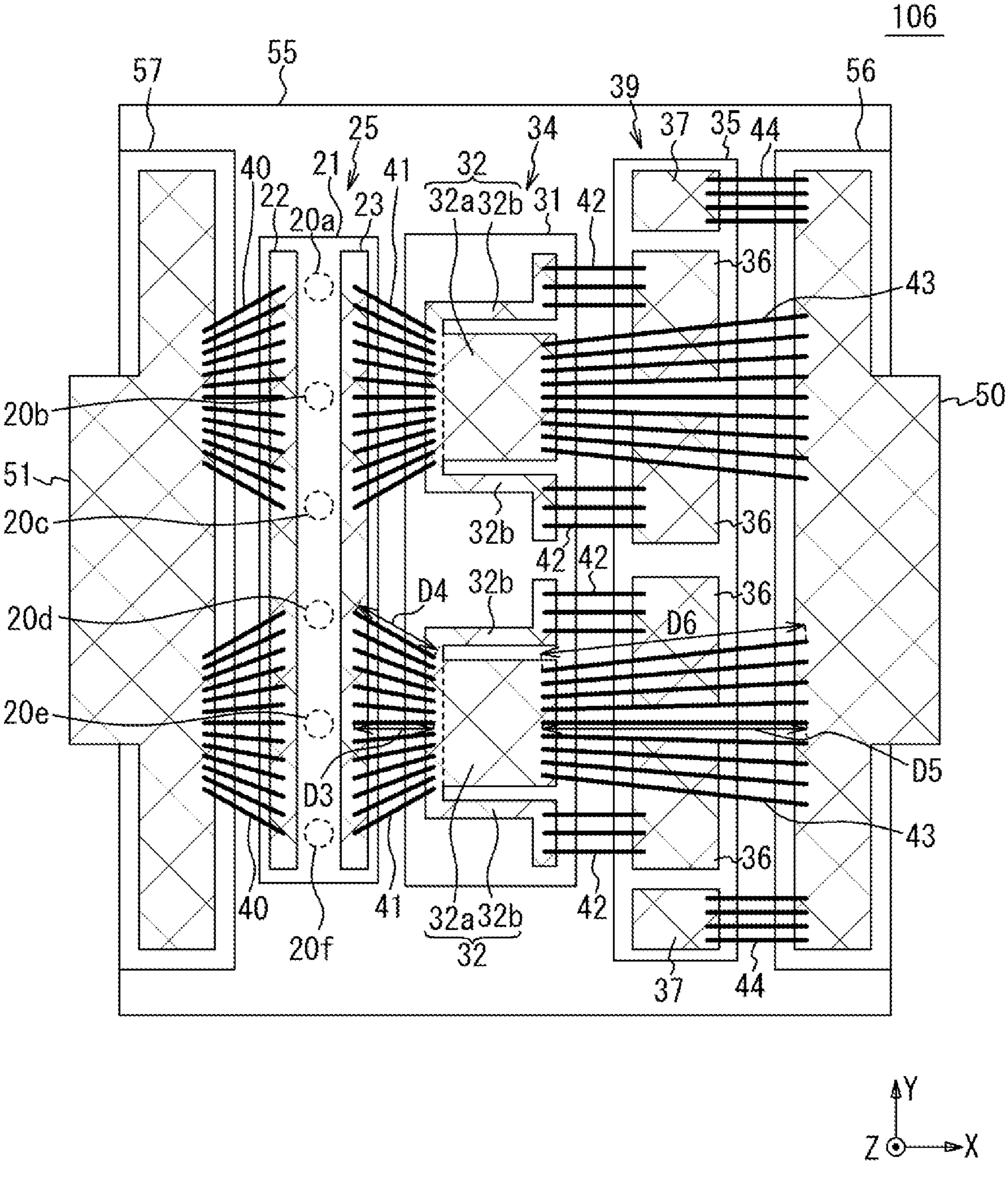
FIG. 16 is a plan view of a semiconductor device according to a fourth modification of the first embodiment.

FIG. 16 is a plan view of a semiconductor device according to a fourth modification of the first embodiment. As illustrated in FIG. 16, in a semiconductor device 106 of the fourth modification of the first embodiment, the plurality of conductor patterns 32 are provided on the wiring component 34. Two line patterns 32*b* are connected to each of two solid patterns 32*a*. Four conductor patterns 36 and two conductor patterns 37 are provided on the capacitive component 39. Bonding wires 42 are connected to four conductor patterns 36 from ends of the four line patterns 32*b* near the capacitive component 39. The four conductor patterns 36 are disposed between the two conductor patterns 37.

The length of the bonding wire 41 located at the center portion in the Y direction among the plurality of bonding wires 41 connected to one conductor pattern 32 is referred to as a length D3. The length of the bonding wire 41 located at the end portion in the Y direction among the plurality of bonding wires 41 connected to the one conductor pattern 32 is referred to as a length D4. The length D4 is larger than the length D3. The length of the bonding wire 43 located at the center portion in the Y direction among the plurality of bonding wires 43 connected to the one conductor pattern 32 is referred to as a length D5. The length of the bonding wire 43 located at the end portion in the Y direction among the plurality of bonding wires 43 connected to the one conductor pattern 32 is referred to as a length D6. The length D6 is large than the length D5. The bonding wire 40 is also formed in the same manner. That is, the length of the bonding wire 40 located at the end portion in the Y direction among the plurality of bonding wires 40 is larger than that of the bonding wire 40 located at the center portion in the Y direction among the plurality of bonding wires 40. The other configuration is the same as that of the first embodiment, and the description thereof is omitted.

Unit transistors 20*a* and 20*f* in the unit transistors 20*a* to 20*f* in the Y direction are located at the ends of the semiconductor chip 25 in the Y direction. The unit transistors 20*c* and 20*d* are located at the center of the semiconductor chip 25 in the Y direction. In this case, as in the first embodiment, when the number of the conductor patterns 32 is one, the inductance between the unit transistors 20*c* and 20*d* and the conductor pattern 36 is larger than the inductance between the unit transistors 20*a* and 20*f* and the conductor pattern 36. Thus, the inductances between the unit transistors 20*a* to 20*f* and the conductor pattern 36 are greatly different from each other. This causes the matching states to differ from each other depending on the respective unit transistors.

In the fourth modification of the first embodiment, the plurality of conductor patterns 32 are provided on the upper surface of the substrate 31 in the Y direction (direction intersecting an arrangement direction of the semiconductor chip 25 and the wiring component 34). This reduces a difference between the inductance between the unit transistors 20*c* and 20*d* and the conductor pattern 36 and the inductance between the unit transistors 20*a* and 20*f* and the conductor pattern 36. Therefore, the matching states of the unit transistors can be made uniform. Also in the second and third modifications of the first embodiment, the plurality of conductor patterns 32 may be provided.

When the lengths of the plurality of bonding wires 41 are made substantially equal to each other as in the first embodiment, the inductance between the unit transistor 20*b* and the conductor pattern 36 in FIG. 2 is larger than the inductance between the unit transistors 20*a* and 20*c* and the conductor pattern 36. This causes the matching states to differ from each other depending on the unit transistors.

In the fourth modification of the first embodiment, as illustrated in FIG. 16, the length D4 of the bonding wire 41 located at the end portion in the Y direction among the plurality of bonding wires 41 is longer than the length D3 of the bonding wire 41 located at the center portion in the Y direction among the plurality of bonding wires 41. This reduces a difference between the inductance between the unit transistors 20*a*, 20*c*, 20*d*, and 20*f* and the conductor pattern 36 and the inductance between the unit transistors 20*b* and 20*e* and the conductor pattern 36. Therefore, the matching states of the unit transistors can be made uniform. The length D4 may be 1.2 times or more the length D3. If the length D4 is too long, the inductance between the unit transistors 20*a*, 20*c*, 20*d*, and 20*f* and the conductor pattern 36 becomes larger than the inductance between the unit transistors 20*b* and 20*e* and the conductor pattern 36. From this viewpoint, the length D4 can be set to be equal to or less than twice the length D3. In the first embodiment and the first to the third modifications thereof, the length D4 may be set to be larger than the length D3.

Second Embodiment

Figure 17:
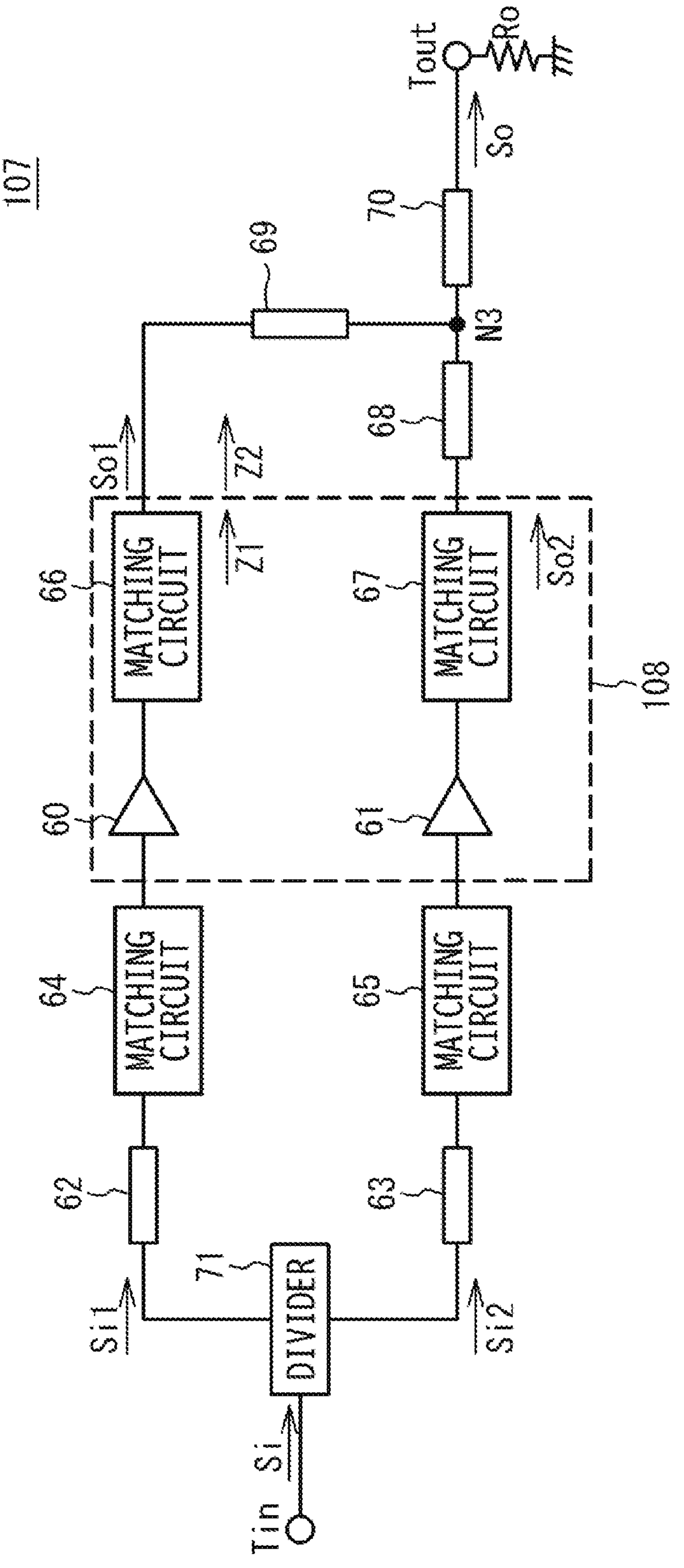
FIG. 17 is a circuit diagram of a Doherty amplifier using a semiconductor device according to a second embodiment.

A second embodiment is an example in which the semiconductor device of the first embodiment and a modification thereof are used in a Doherty amplifier. FIG. 17 is a circuit diagram of the Doherty amplifier using the semiconductor device of the second embodiment. As illustrated in FIG. 17, in a Doherty amplifier 107, a main amplifier 60 and a peak amplifier 61 are connected in parallel between the input terminal Tin and the output terminal Tout. A high frequency signal is input to the input terminal Tin as an input signal Si. A divider 71 divides the input signal Si input to the input terminal Tin into signals Si1 and Si2. The divider 71 is, for example, a Wilkinson type divider or a hybrid coupler.

The signal Si1 passes through an offset line 62 and a matching circuit 64 and is input to the main amplifier 60. The offset line 62 adjusts the phases of the main amplifier 60 and the peak amplifier 61. The matching circuit 64 matches an impedance when the matching circuit 64 is viewed from the offset line 62 with an impedance when the main amplifier 60 is viewed from the matching circuit 64. The main amplifier 60 amplifies the signal Si1 and outputs the amplified signal as a signal So1. The signal So1 amplified by the main amplifier 60 is output to a node N3 via the matching circuit 66 and an impedance converter 69. The matching circuit 66 matches an impedance when the main amplifier 60 is viewed from the matching circuit 66 with an impedance when the impedance converter 69 is viewed from the matching circuit 66. The impedance converter 69 converts the impedance when the impedance converter 69 is viewed from the matching circuit 66 into the impedance when the node N3 is viewed from the impedance converter 69.

The signal Si2 passes through an offset line 63 and a matching circuit 65 and is input to the peak amplifier 61. The offset line 63 adjusts the phases of the main amplifier 60 and the peak amplifier 61. The matching circuit 65 matches an impedance when the matching circuit 65 is viewed from the offset line 63 with an impedance when the peak amplifier 61 is viewed from the matching circuit 65. The peak amplifier 61 amplifies the signal Si2 and outputs the amplified signal as a signal So2. The signal So2 amplified by the peak amplifier 61 passes through a matching circuit 67 and an offset line 68 and is output to the node N3. The matching circuit 67 matches an impedance when the matching circuit 67 is viewed from the peak amplifier 61 with an impedance when the node N3 is viewed from the matching circuit 67.

The node N3, which is a combining node, combines the signal So1 output from the main amplifier 60 and the signal So2 output from the peak amplifier 61, and outputs the combined signal as an output signal So to the output terminal Tout through an impedance converter 70. The impedance converter 70 converts an impedance when the impedance converter 70 is viewed from the node N3 into an impedance when the output terminal Tout is viewed from the impedance converter 70. The output terminal Tout is terminated by a load resistor R0. The load resistance R0 is, for example, a reference impedance of 50Ω. At this time, an impedance when the output terminal Tout is viewed from the impedance converter 70 is substantially only a resistance component and is 50Ω.

A semiconductor device 108 of the second embodiment includes the main amplifier 60, the peak amplifier 61, and the matching circuits 66 and 67. The semiconductor device 108 may include the matching circuits 64 and 65.

The main amplifier 60 operates in class AB or class B, and the peak amplifier 61 operates in class C. When the input power of the input signal Si is small, the main amplifier 60 mainly amplifies the input signal Si. When the input power increases, the peak amplifier 61 amplifies the peak of the input signal Si in addition to the main amplifier 60. In this way, the main amplifier 60 and the peak amplifier 61 amplify the input signal Si.

For example, the impedance when the matching circuit 64 is viewed from the offset line 62 and the impedance when the matching circuit 65 is viewed from the offset line 63 are substantially only a resistance component and are 50Ω. The impedance when the impedance converter 69 is viewed from the matching circuit 66 and the impedance when the offset line 68 is viewed from the matching circuit 67 are substantially only a resistance component and are 50Ω. By setting the input impedance and the output impedance to 50Ω, the matching circuits 64 to 67 can be easily designed.

When the input power is small and the peak amplifier 61 does not operate, the offset line 68 makes an impedance when the offset line 68 is viewed from the node N3 substantially infinite. On the other hand, when the input power is large and the peak amplifier 61 operates, the impedance when the node N3 is viewed from the offset line 68 is substantially a resistance component and is 50Ω. The characteristic impedance of the offset line 68 is 50Ω, and the length thereof is set to satisfy the above conditions.

The impedance converter 69 is a transmission line having a characteristic impedance of 50Ω and a length of λ/4. The "λ" is a wavelength in the operating band. The impedance converter 69 converts an impedance of a substantially resistive component into an impedance having a different magnitude of a substantially resistive component. When the peak amplifier 61 does not operate, the matching circuit 66 matches the load impedance of the main amplifier 60 to 100Ω. The impedance when the node N3 is viewed from the impedance converter 69 is substantially a resistance component and is 50Ω. The impedance converter 69 converts 50Ω to 100Ω. When the peak amplifier 61 operates, the matching circuit 66 matches the load impedance of the main amplifier 60 to 50Ω. Since the characteristic impedance of the impedance converter 69 is 50Ω, the impedance is not converted.

The impedance converter 70 is a transmission line having a characteristic impedance of 33.4Ω and a length of λ/4. When the peak amplifier 61 operates, the impedance when the node N3 is viewed from the impedance converter 69 and the impedance when the node N3 is viewed from the offset line 68 are both 50Ω. The impedance converter 70 converts the impedance of 25Ω when the impedance converter 70 is viewed from the node N3 into 50Ω of the load resistance R0.

The offset lines 62 and 63 have a characteristic impedance of 50Ω. The offset lines 62 and 63 adjust the phases of the main amplifier 60 and the peak amplifier 61. Any one of the offset lines 62 and 63 may not be provided.

When a hybrid coupler is used as the divider 71, the phase of the signal Si2 can be delayed by 90 degrees from the phase of the signal Si1. This makes it possible to compensate for a phase difference in the impedance converter 69.

Figure 18:
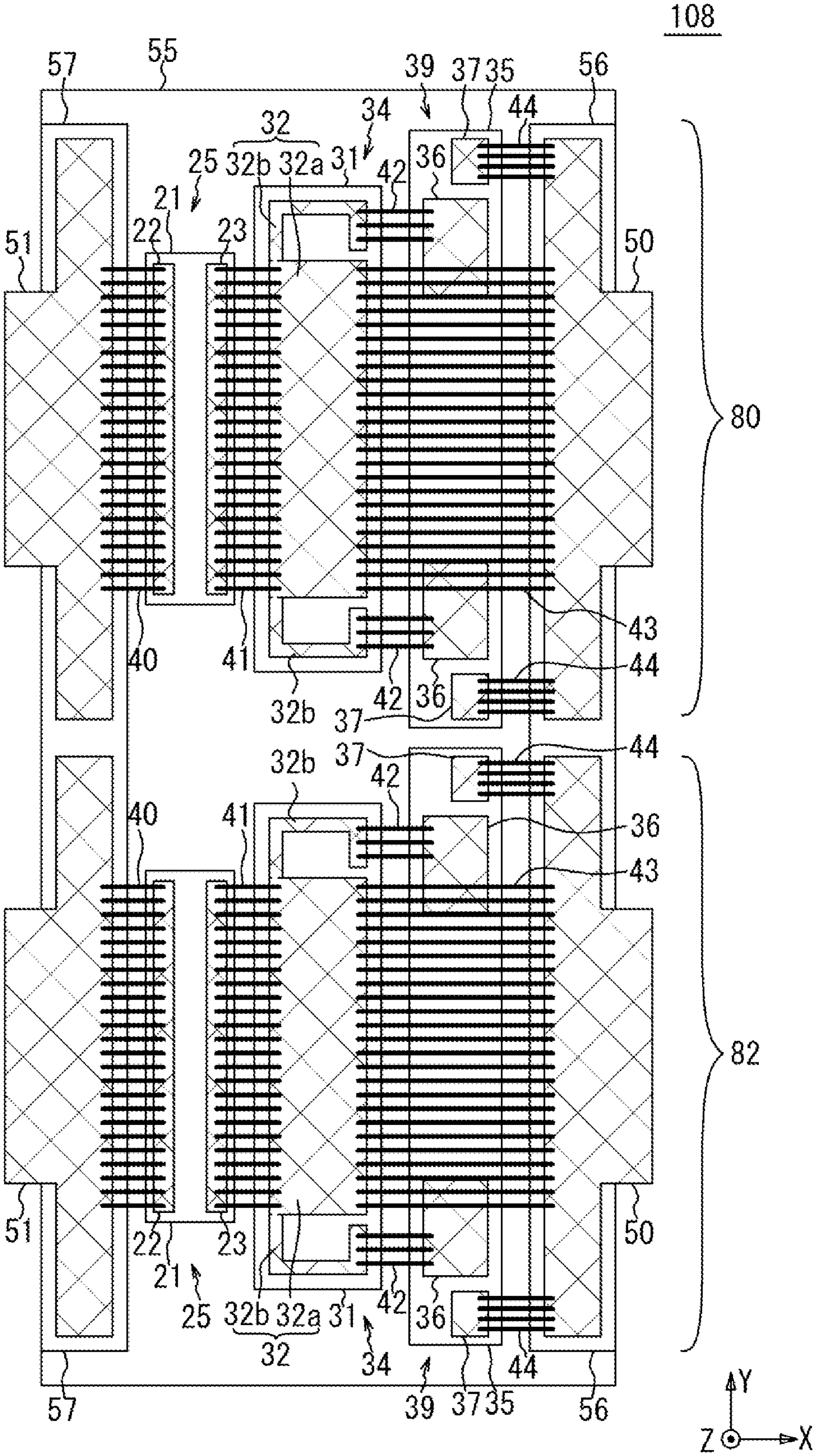
FIG. 18 is a plan view of the semiconductor device according to the second embodiment.

FIG. 18 is a plan view of a semiconductor device according to a second embodiment. As illustrated in FIG. 18, in the semiconductor device 108 according to the second embodiment, two sets 80 and 82 each having the input lead 51, the semiconductor chip 25, the wiring component 34, the capacitive component 39, and the output lead 50 are provided. The two sets 80 and 82 are arranged in the Y direction. The set 80 includes the main amplifier 60 and the set 82 includes the peak amplifier 61. The other configuration is the same as that of the first embodiment, and the description thereof is omitted.

The impedances were simulated when the matching circuit 66 was the circuit A of FIG. 6 and the circuit B of FIG. 8. In the simulation, it is assumed that the peak amplifier 61 does not operate and the impedance when the peak amplifier 61 is viewed from the node N3 is infinite. As the main amplifier 60, a GaN HEMT is assumed. The matching circuit 66 converts the load impedance of the main amplifier 60 into the impedance Z1. The impedance converters 69 and 70 convert the impedance Z2 into 50Ω. The matching circuit 66 and the impedance converters 69 and 70 were optimized so that the impedances Z1 and Z2 were the best matched at frequencies of 3.4 GHz, 3.6 GHz, and 3.8 GHz.

Figure 19:
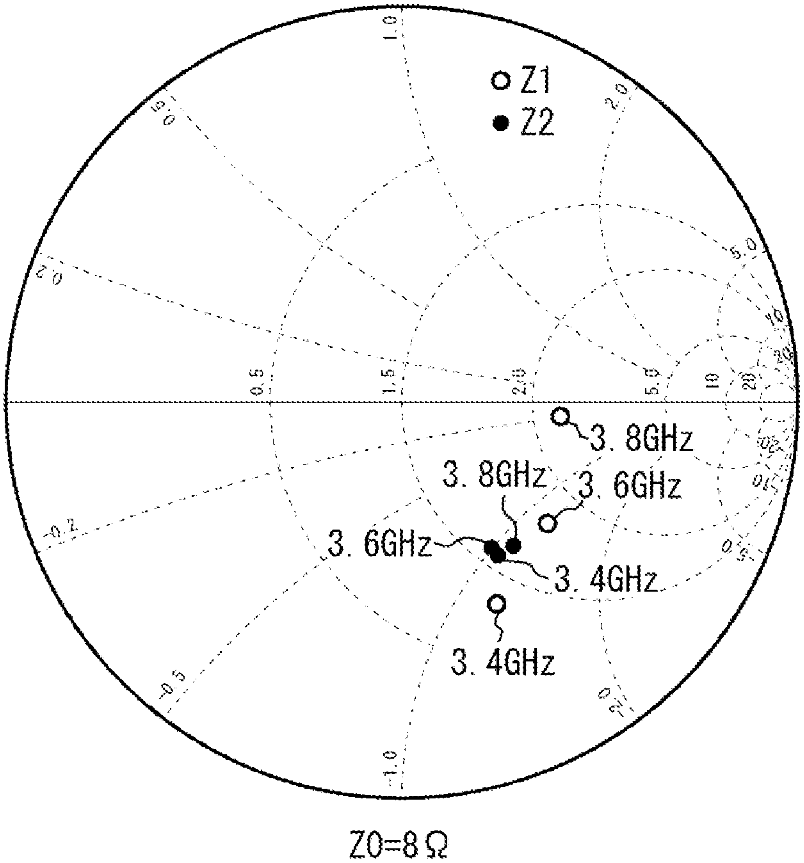
FIG. 19 is a Smith chart illustrating impedances Z1 and Z2 when the circuit A is used in a matching circuit 66.

FIG. 19 is a Smith chart illustrating the impedances Z1 and Z2 when the circuit A is used in the matching circuit 66. The inductance of the inductor L3 is 0.32 nH, and the capacitance of the capacitor C2 is 10 pF. The reference impedance Z0 is 8Ω. As illustrated in FIG. 19, when the frequency increases, the impedance Z1 rotates counterclockwise on the Smith chart around the center of the Smith chart. The impedance Z2 does not change much even if the frequency changes, and when the frequency increases, the impedance Z2 slightly rotates clockwise on the Smith chart around the center of the Smith chart. Therefore, even if the impedances Z1 and Z2 are matched at 3.6 GHz, the impedances Z1 and Z2 are not matched at 3.4 GHz and 3.8 GHz.

Figure 20:
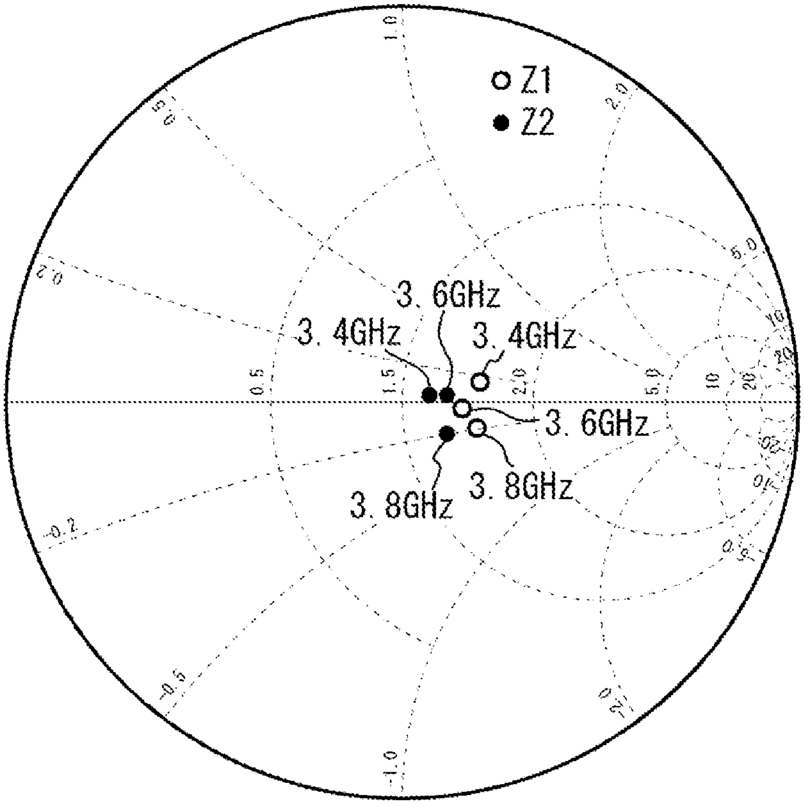
FIG. 20 is a Smith chart illustrating impedances Z1 and Z2 when the circuit B is used in the matching circuit 66.

FIG. 20 is a Smith chart illustrating the impedances Z1 and Z2 when the circuit B is used in the matching circuit 66. The inductances of the inductors L1, L2 and L3 are 0.07 nH, 0.17 nH and 0.19 nH, respectively, and the capacitance of the capacitor C2 is 6 pF. The reference impedance Z0 is 8Ω. As illustrated in FIG. 20, the impedance Z1 does not change even when the frequency increases, and the impedance Z1 slightly rotates clockwise on the Smith chart around the center of the Smith chart. The impedance Z2 does not change even when the frequency increases, and The impedance Z2 slightly rotates clockwise on the Smith chart around the center of the Smith chart. Therefore, the impedances Z1 and Z2 can be matched in the frequency range from 3.4 GHz to 3.8 GHz.

As in the above simulation, the semiconductor chip 25, the wiring component 34, and the capacitive component 39 are used as the main amplifier 60 and the matching circuit 66 of the Doherty amplifier 107. This makes it possible to widen the band of the matching circuit 66. Therefore, the Doherty amplifier can be widened in band and reduced in size.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. A semiconductor device comprising:
a signal terminal to which a high-frequency signal is input or output;
a base having a conductive upper surface to which a reference potential is supplied;
a semiconductor chip mounted on the base and having a signal pad provided on an upper surface of the semiconductor chip;
a wiring component mounted on the base and including a substrate and a first conductor pattern provided on an upper surface of the substrate;
a capacitive component mounted on the base and including a dielectric substrate, a second conductor pattern provided on an upper surface of the dielectric substrate, and a third conductor pattern provided on an upper surface of the dielectric substrate and separated from the second conductor pattern;
a first bonding wire that electrically connects the signal pad to the first conductor pattern;
a second bonding wire that electrically connects the first conductor pattern to the second conductor pattern;
a third bonding wire that electrically connects the first conductor pattern to the signal terminal; and
a fourth bonding wire that electrically connects the signal terminal to the third conductor pattern.

2. The semiconductor device according to claim 1, wherein
the dielectric substrate, the second conductor pattern, and the base form a first capacitor, and
the dielectric substrate, the third conductor pattern and the base form a second capacitor.

3. The semiconductor device according to claim 2, wherein
an area of the second conductor pattern is larger than an area of the third conductor pattern.

4. The semiconductor device according to claim 3, wherein
the first bonding wire, the second bonding wire, and the first capacitor form a high-pass circuit, and
the third bonding wire, the fourth bonding wire, and the second capacitor form a low-pass circuit.

5. The semiconductor device according to claim 1, wherein
the first conductor pattern includes a solid pattern to which the first bonding wire and the third bonding wire are bonded, and a line pattern connected to an end of the solid pattern close to the semiconductor chip and extending toward the capacitive component, and
the second bonding wire is bonded to an end of the line pattern close to the capacitive component.

6. The semiconductor device according to claim 1, wherein
a number of third bonding wires is larger than a number of fourth bonding wires.

7. The semiconductor device according to claim 1, wherein
the second conductor pattern includes a plurality of second conductor patterns,¥
the second bonding wire includes a plurality of second bonding wires,
the plurality of second conductor patterns are provided on the upper surface of the dielectric substrate, and
the plurality of second bonding wires connected to the plurality of second conductor patterns, respectively, are provided with the third bonding wire interposed therebetween.

8. The semiconductor device according to claim 7, wherein
the first bonding wire includes a plurality of first bonding wires, and
a first bonding wire located at an end portion of the plurality of first bonding wires in an arrangement direction among the plurality of first bonding wires connected to the first conductor pattern is longer than a first bonding wire located at a center portion of the plurality of first bonding wires in the arrangement direction among the plurality of first bonding wires.

9. The semiconductor device according to claim 1, wherein
the third conductor pattern includes a plurality of third conductor patterns,
the fourth bonding wire includes a plurality of fourth bonding wires,
the plurality of third conductor patterns are provided on the upper surface of the dielectric substrate, and
the plurality of fourth bonding wires connected to the plurality of third conductor patterns, respectively, are provided with the third bonding wire interposed therebetween.

10. The semiconductor device according to claim 1, wherein
the first conductor pattern includes a plurality of the first conductor patterns provided on the upper surface of the substrate in a direction intersecting the arrangement direction of the semiconductor chip and the wiring component.

11. The semiconductor device according to claim 1, wherein
the semiconductor chip includes a transistor, and the signal terminal outputs the high-frequency signal.

12. The semiconductor device according to claim 11, wherein
the transistor is a main amplifier of a Doherty amplifier.

* * * * *